United States Patent
Tsubosaki et al.

(10) Patent No.: US 6,664,616 B2
(45) Date of Patent: *Dec. 16, 2003

(54) SEMICONDUCTOR DEVICE AND MANUFACTURING METHOD THEREOF

(75) Inventors: Kunihiro Tsubosaki, Hino (JP); Toshio Miyamoto, Kodaira (JP)

(73) Assignee: Hitachi, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/308,620

(22) PCT Filed: Nov. 21, 1996

(86) PCT No.: PCT/JP96/03407

§ 371 (c)(1),
(2), (4) Date: Jul. 20, 1999

(87) PCT Pub. No.: WO98/22980

PCT Pub. Date: May 28, 1998

(65) Prior Publication Data

US 2002/0180010 A1 Dec. 5, 2002

(51) Int. Cl.[7] .............................................. H01L 23/495
(52) U.S. Cl. .................. 257/668; 257/679; 257/680; 257/774; 257/673; 257/780; 257/686
(58) Field of Search ........................ 257/668, 679–680, 257/774, 673, 780, 686, 678, 684, 690, 737, 779, 787

(56) References Cited

U.S. PATENT DOCUMENTS

| | | | | |
|---|---|---|---|---|
| 4,460,825 A | * | 7/1984 | Haghiri-Tehrani et al. | 174/52.4 |
| 4,829,666 A | * | 5/1989 | Haghiri et al. | 29/841 |
| 5,196,917 A | * | 3/1993 | Ueda et al. | 357/70 |
| 5,422,163 A | * | 6/1995 | Kamiyama et al. | 257/666 |
| 5,729,051 A | * | 3/1998 | Nakamura | 257/668 |
| 5,811,877 A | * | 9/1998 | Miyano et al. | 257/669 |

FOREIGN PATENT DOCUMENTS

| | | |
|---|---|---|
| JP | 54-114973 A | 9/1979 |
| JP | 59-222947 A | 12/1984 |
| JP | 60106153 | 6/1985 |
| JP | 6352431 | 3/1988 |
| JP | 6471162 | 3/1989 |
| JP | 3-295264 A | 12/1991 |
| JP | 4-355939 A | 12/1992 |
| JP | 5-183020 A | 7/1993 |
| JP | 5-291218 | 11/1993 |
| JP | 6-151517 A | 5/1994 |
| JP | 8-88245 A | 4/1996 |
| JP | 8-148526 A | 6/1996 |
| JP | 8-222691 A | 8/1996 |
| JP | 8-236694 A | 9/1996 |

* cited by examiner

Primary Examiner—David L. Talbott
Assistant Examiner—Luan Thai
(74) Attorney, Agent, or Firm—Antonelli, Terry, Stout & Kraus, LLP

(57) ABSTRACT

A semiconductor chip 2 is disposed within a device hole as formed in a tape base material 1a of a tape carrier 1, which chip is smaller in thickness than the tape base material 1a, and then sealing is performed using a seal resin 3 to permit both the principal surface and back surface of such semiconductor chip 2 to be coated therewith. And, the position of the semiconductor chip 2 in a direction along the thickness of the tape base 1a is set to correspond to a stress neutral plane of the TCP as a whole.

15 Claims, 34 Drawing Sheets

FIG. 4
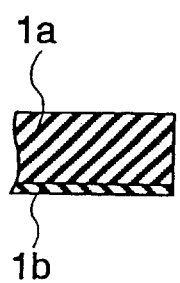
FIG. 5
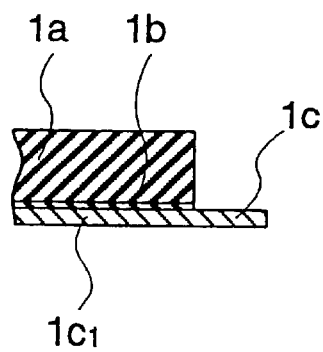 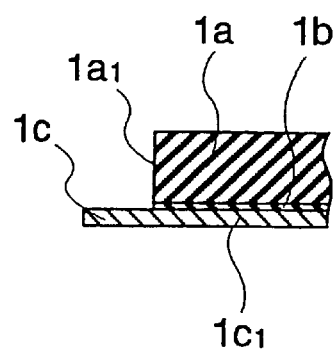

FIG. 6
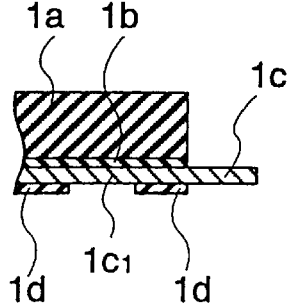
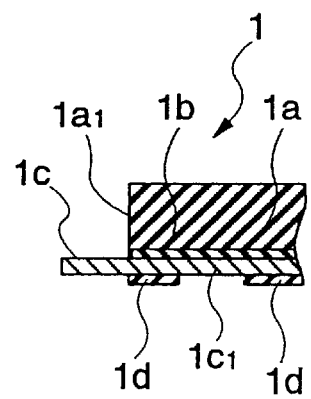
FIG. 7
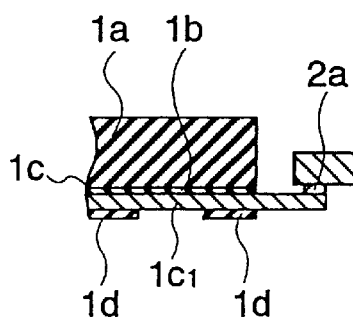
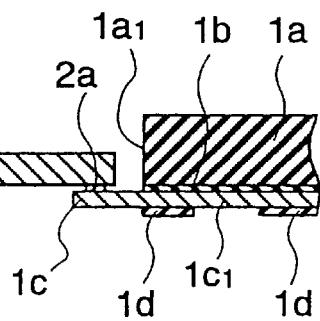

SEMICONDUCTOR DEVICE AND MANUFACTURING METHOD THEREOF

BACKGROUND OF THE INVENTION

The present invention relates generally to semiconductor devices and the manufacturing methodology thereof; and, more particularly, the invention relates to technologies usefully applicable to high-density mountable semiconductor devices with tape carrier package (TCP) structures along with fabrication methods thereof.

In recent years, as portable or handheld electronic equipment, of reduced shape and thickness, and yet with much increased functionalities, is being developed for mass production, TCP technologies are becoming more and more important in the manufacture of solid-state integrated circuit (IC) packages for use in highly advanced electronic equipment with respect to the enhanced mountability of thickness-reduced or "thin" electronics components and also to the ability to increase the number of package pins.

The TCP is a package including a tape carrier having a plurality of conductive leads formed thereon in a repeated pattern, wherein a semiconductor chip is placed on or in the tape carrier with its electrode pads lamination-contacted with corresponding ones of the carrier leads for electrical interconnection therebetween, the semiconductor chip being sealed by a sealing resin material or the like.

Prior known TCPs typically have been designed so that the semiconductor chip being used is greater in thickness than the tape carrier, which would result in an increase in the mounting height of a multilayer tape structure wherein multiple unitary tape carriers are laminated on one another. One prior art approach to mount-height reduction has been described, for example, in Japanese Patent Application Laid-Open No. 63(1985)-52431 ("JP-A-63-52431"), which discloses a tape carrier for use with a certain semiconductor chip having its bottom or back surface cut away. Another approach is found in JP-A-5(1993)-291218, which discloses therein a technique for making both the semiconductor chip and the tape carrier thinner at the same time.

Another TCP structure is also known which includes a specific frame structure, called a "stiffener" in the semiconductor device art. The stiffener is provided around a semiconductor chip with its back surface in contact with a heat release member known as a "heat spreader." In this TCP, a tape carrier is mounted on the stiffener for providing a junction between one end of its lead and the semiconductor chip while simultaneously providing a bump electrode at the other end of such lead. In this case the resultant TCP structure suffers from an excessive increase in thickness, which would result in an inability to achieve the desired multilayer structures.

Still another TCP structure has been found through analysis by the present inventors, which TCP structure is designed to employ a semiconductor chip that is thinner than a tape carrier having an opening called a "device hole." The "thin" semiconductor chip is disposed in the tape carrier's device hole with its back surface being substantially at the same level as or coplanar with the bottom surface of the tape carrier. The principal surface and sidewalls of such a semiconductor chip are coated with a chosen sealing resin material. Unfortunately, this TCP structure has encountered a problem in that the semiconductor chip can warp after completion of the sealing processes due to the fact that only its principal surface and sidewalls are partly subject to sealing by use of the seal resin. To this end, this TCP structure must be designed to employ an extra hard or rigid plate for use in eliminating the occurrence of chip cracks in the back surface of the semiconductor chip. However, this does not come without an additional problem in that the resultant TCP is increased in thickness, thereby discouraging experts in the art from attempting to use such a "thick" TCP to attain a desired multilayer structure. While a structure with a seal plate provided on the seal resin is known, this also suffers from the TCP thickness increase problem, and is not suitable for use as a multilayer structure. Additionally, a thin package structure using a film substrate with its lower surface coplanar with the back surface of a chip has been disclosed, for example, in JP-A-60(1985)-106153.

According to currently available technologies recognized by the present inventors, the semiconductor chips are thinner than the tape carriers in most TCP structures. In cases where such TCPs are laminated on one another to form a multilayer structure, the outer leads are typically machined to have a so-called "gull-wing" shape for elimination of unwanted contact of a semiconductor chip with its associated mounting board, such as a printed circuit board. In addition, in case plural ones are to be mounted in the direction along the thickness of the TCP, a specific parts-mount scheme must be employed which includes the steps of pre-fabricating those TCPs with outer leads of different lengths, and, after completion of various lead machining processes, rearranging the layout in a way such that those with low mount heights are located at lower levels, whereas the remaining ones with higher mount levels are at upper levels. In this case, however, different tape carriers are used to accomplish the intended overlap mounting with outer leads different in size from one another. This in turn calls for the use of a variety of types of tape carriers as well as various molding die tools, which would result in an increase in production cost therefor. Additionally, the TCP lamination mount technique is disclosed in JP-A-64(1989)-71162, for example.

It is therefore an object of the present invention to provide a technique for enabling the manufacture of a semiconductor device with a TCP structure which is high in reliability.

Another object of this invention is to provide a technique for enabling fabrication of a thin small-size semiconductor device with TCP structures offering high-density mountability and enhanced reliability, while reducing costs.

These and other objects, features and advantages of the invention will be apparent from the following more particular description of various preferred embodiment of the invention, as illustrated in the accompanying drawings.

SUMMARY OF THE INVENTION

A semiconductor device in accordance with the present invention is specifically arranged to include a semiconductor chip disposed in a device hole provided in a tape carrier with one end of a lead on said tape carrier being electrically connected to an external terminal of said semiconductor chip, wherein said semiconductor chip is smaller in thickness than said tape carrier, and wherein said semiconductor chip is sealed by a seal resin material to allow a principal surface and a back surface of said semiconductor chip to be coated therewith. Whereby, it becomes possible to reduce any possible stress that the semiconductor chip can receive from the principal surface and rear surface thereof. Also, the semiconductor device of this invention is such that said semiconductor chip is disposed on a stress neutral plane extending parallel to the principal surface of said semiconductor chip at the position along a thickness of said tape carrier. This makes it possible to allow the semiconductor chip to be placed at a location whereat the stress receivable from the TCP is kept minimal. Even in the event any external force is applied causing the TCP to deform as a whole, the semiconductor chip may be subjected to a minimal stress. It is also possible to suppress the occurrence of warp in the overall TCP structure due to bimetal effects, which may in turn enable noticeable reduction of risks of chip cracks and/or connection failures during mounting assembly procedures of the semiconductor device.

In addition, the semiconductor device of the instant invention is such that a passage for use in seal resin injection is formed at part of said tape carrier thereby causing said device hole to be coupled to a gate of a metal mold structure used during formation of said seal resin. With such an arrangement, it is possible to successfully inject the seal resin so that resin uniformly covers both the principal surface and rear surface of the semiconductor chip, which in turn makes it possible to greatly suppress the formation of voids and/or traps in the seal resin.

In addition, the semiconductor device of this invention is such that said tape carrier has an air exhaust port formed to allow the device hole of said tape carrier to be coupled to an air vent of the metal mold structure for use during formation of said seal resin. It is thus possible to suppress any residual air inside of the seal resin coating both the principal surface and rear surface of the semiconductor chip, which in turn enables significant reduction in the creation of voids and/or traps within the seal resin. Accordingly, the semiconductor device may be further improved in reliability.

In addition, the semiconductor device of the invention is such that an electroplated metal layer is formed at part of a surface of said tape carrier in close proximity to said passage for seal resin injection, the part being brought into contact with the seal resin during formation of said seal resin coating. Whereby, it is possible to reduce the adhesive bondability between the seal resin and tape carrier, which in turn makes it possible to accelerate peel-off or debonding of the resin from the tape carrier during separation between the TCP and the sub-runner's resin to be carried out after the resin seal process.

In addition, the semiconductor device of the invention is such that said semiconductor chip has its back surface polished by a spin etching technique. This may permit reduction in the thickness of the semiconductor chip. Simultaneously, it is possible to make the rear surface of the semiconductor chip smoother thereby enabling the semiconductor chip to offer a physically robust structure with enhanced resistivity to flexure/bending stresses while remaining hard-crackable.

In addition, a semiconductor device of the invention is arranged to have a multilayer package structure including a plurality of laminated tape carriers with a semiconductor chip which is smaller in thickness than each tape carrier being disposed in a device hole of each tape carrier, wherein one end of a lead provided to each of said plurality of laminated tape carriers is electrically connected to an external terminal of the semiconductor chip in the device hole of each tape carrier, wherein each semiconductor chip is coated with seal resin on both a principal surface and a back surface thereof, and wherein each of said laminated tape carriers has a common signal transmission lead and a power supply lead each being electrically connected to corresponding ones of other carriers to be externally drawn out as a connection terminal being electrically connected to a lead of a mounting board. With such an arrangement, it becomes possible to provide an improved semiconductor device of a thickness-reduced or thinner TCP structure, while increasing the mountability or packaging density of the semiconductor chips thereon.

In addition, the semiconductor device of the invention is arranged so that a connection hole is defined in each of said tape carriers laminated on one another, thereby causing part of said lead to be exposed while permitting part of said lead to project into said connection hole, and also a conductive material is buried in the connection hole to allow a common signal transmission lead and a power supply lead of each said tape carrier to be electrically connected together. Whereby, it is possible to make sure that the lead is in contact with the conductive material within said connection hole, which in turn makes it possible to improve the connection reliability within such connection hole.

In addition, the semiconductor device of the invention is such that a connection hole is defined in each of said plurality of tape carriers laminated on one another, thereby causing part of said lead to be exposed, while applying electroplating to the inside of the connection hole, thus allowing each of a common signal transmission lead and a power supply lead of each said tape carrier to be electrically connected to corresponding ones of the remaining carriers. Whereby, a conductive section is formed within the connection hole by use of currently available long-use electroplating techniques, which in turn enables the conductive section to be formed inside of the connection hole with minimized complexity.

In addition, the semiconductor device of the invention is such that a connection hole is defined in each of said plurality of tape carriers laminated on one another thereby causing part of said lead to be exposed while inserting a conductive pin into the connection hole thus allowing each of a common signal transmission lead and a power supply lead of each said tape carrier to be electrically connected to corresponding ones of remaining carriers with one end of said conductive pin being extended from a mounting surface of said multilayer package as said connection terminal. Whereby, it becomes possible to improve the mechanical strength or robustness of the multilayer TCP structure while reducing costs.

In addition, the semiconductor device of the invention is arranged to allow a remaining end of a lead of each of said plurality of tape carriers laminated on one another to extend from an outer periphery of each tape carrier to provide a projected lead portion which is bent for lamination with others to thereby permit electrical connection between a common signal line of each of said plurality of laminated tape carriers and corresponding ones of other tape carriers and also between a power supply line of each tape carrier and corresponding ones of other carriers. With the outer lead deformed in structure, it is possible to increase the mechanical strength of the lead configuration while reducing the complexity and costs. It is also possible to attain enhanced absorbability of thermal expansivity differences between the multilayered TCP and the mounting board.

In addition, the semiconductor device of the invention is arranged to prevent a bump electrode from contact with a certain external terminal of said semiconductor chip to permit modification of a connection route between said semiconductor chip and lead. Whereby, it is possible by use of tape carriers of the singular type to flexibly accommodate any possible modifications or alterations as to connection routes for different signal transmission paths.

In addition, a semiconductor device manufacturing method in accordance with the invention include the steps of:

(a) defining a connection opening or hole in said tape carrier to allow part of said lead to be exposed from the inside wall surface;

(b) burying conductive paste inside of said tape carrier;

(c) laminating multiple tape carriers each similar to said tape carrier on one another while causing said connection hole to remain uniform in formation position among them to thereby form a multilayer package; and (d) applying thermal processing to the resultant multilayer package after completion of said lamination process step to thereby allow conductive paste components residing inside of the connection holes of respective ones of said tape carriers to become integral together. Whereby, it is possible to permit unitary packages to be contacted together without having any adhesive layer sandwiched between adjacent ones of them.

In addition, the method of manufacture of the semiconductor device of the invention includes the steps of:

(a) laminating said unitary packages on one another using an adhesive to form a multilayer package;

(b) burying a conductive paste within a connection hole as defined in each tape carrier of said multilayer package; and (c) applying thermal processing to said multilayer package. Whereby, it becomes possible to dispose adjacent unitary packages in contact with each other by use of an adhesive layer constituting the unitary packages, which in turn makes it possible to manufacture the intended multilayer TCP without an increase in the number of process steps in the manufacture thereof.

In addition, the semiconductor device manufacturing method of the invention is such that external terminals of said semiconductor chip are disposed in contact with leads by a single-point bonding technique while preventing a certain external terminal of said external terminals from contact with a specified lead. Whereby, it is possible by using tape carriers of the same type to accommodate any possible connection route modifications with increased flexibility.

In addition, a method of manufacturing a semiconductor device also incorporating the principles of the invention includes the steps of:

(a) preparing a tape carrier of a specified thickness with leads disposed around said device hole;

(b) preparing a semiconductor chip which is smaller in thickness than said semiconductor chip and having more than one external terminal;

(c) disposing said semiconductor chip which is thinner than said tape carrier within the device hole of said tape carrier and then electrically connecting the external terminal of said semiconductor chip to one end of said lead; and (d) after lamination of a plurality of tape carriers each with said external terminal electrically connected to the lead, sealing respective semiconductor chips disposed within device holes of respective tape carriers using a seal resin at one time. Whereby, it becomes possible to reduce in number the process steps required in the manufacture of the multilayer TCP structure. It is also possible to increase or maximize the mechanical strength while improving the resistivity against humidity because of the fact that no gap spaces are formed between tape layers due to integral formation of the seal resin for use in sealing multiple semiconductor chips together.

BRIEF DESCRIPTION OF THE DRAWINGS

FIGS. 4 through 10 illustrate in cross-section some of the major steps in the manufacture of the semiconductor device of FIG. 1;

DETAILED DESCRIPTION OF THE PREFERRED EMBODIMENTS

Figure 1:
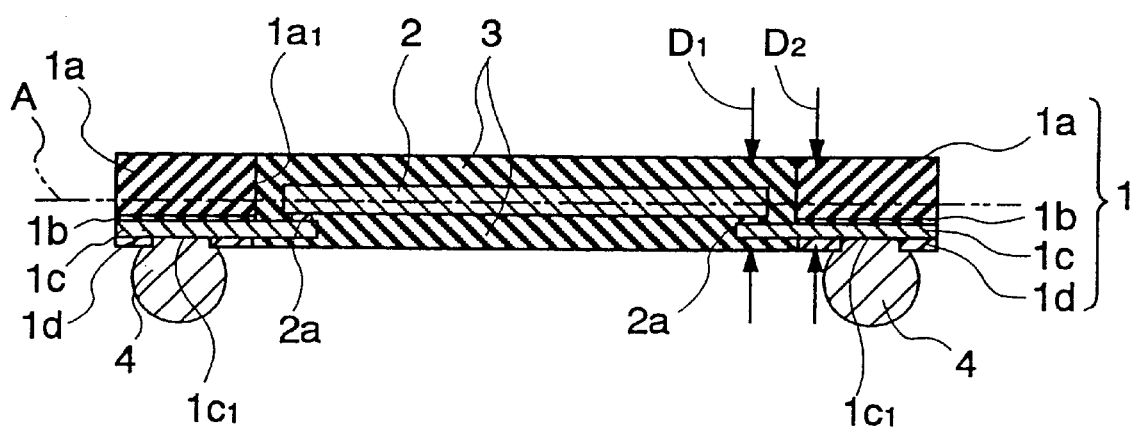
FIG. 1 is a diagram illustrating in cross-section a semiconductor device in accordance with one preferred embodiment of the present invention.

Some preferred embodiments of the present invention will now be explained with reference to the accompanying drawings. Note that in all the drawings for use in explaining the embodiments, like reference characters are used to designate like parts or components and any duplicative explanation will be avoided herein.

Figure 2:
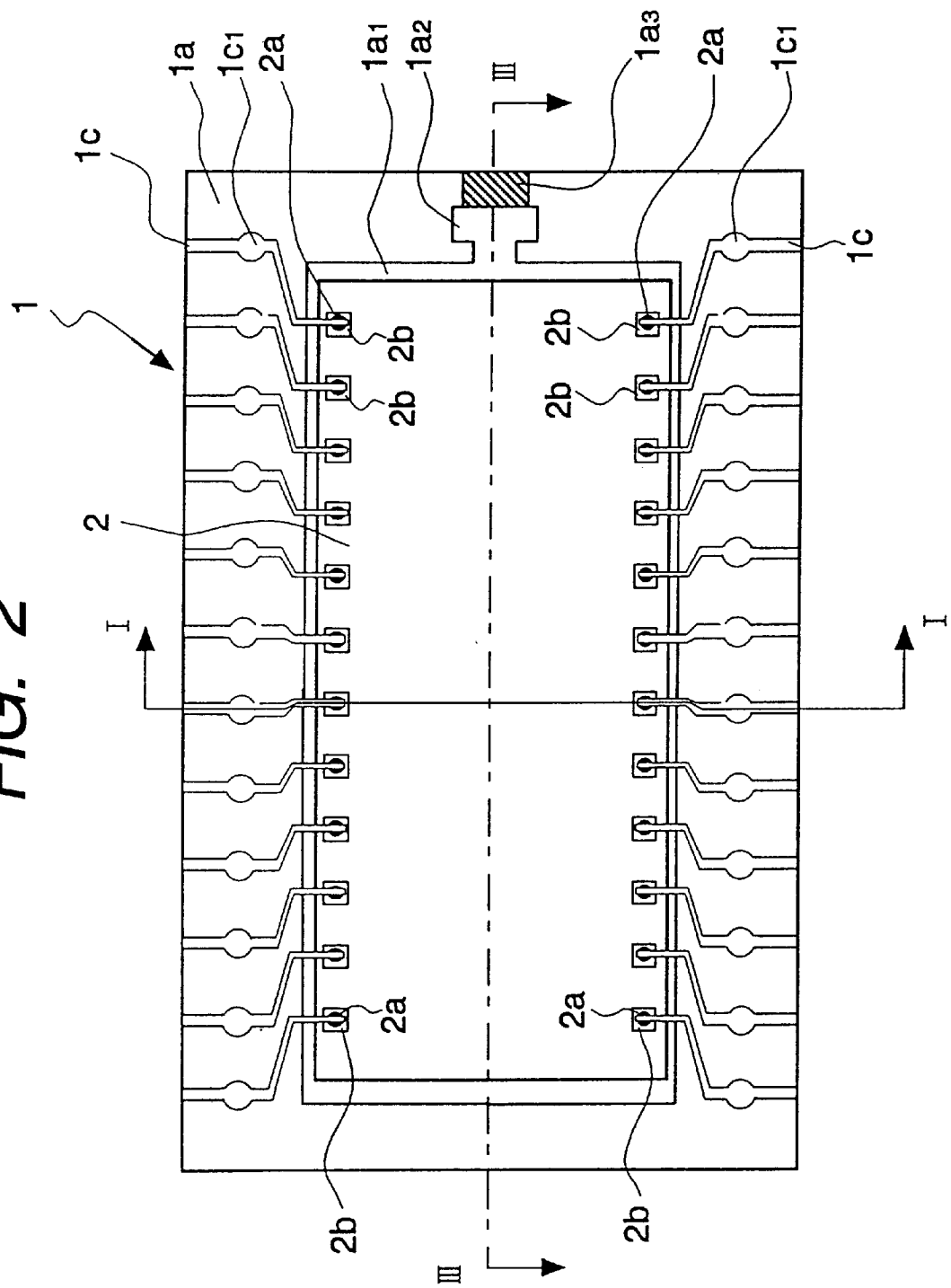
FIG. 2 is a plan view of the semiconductor device of FIG. 1.
Figure 3:
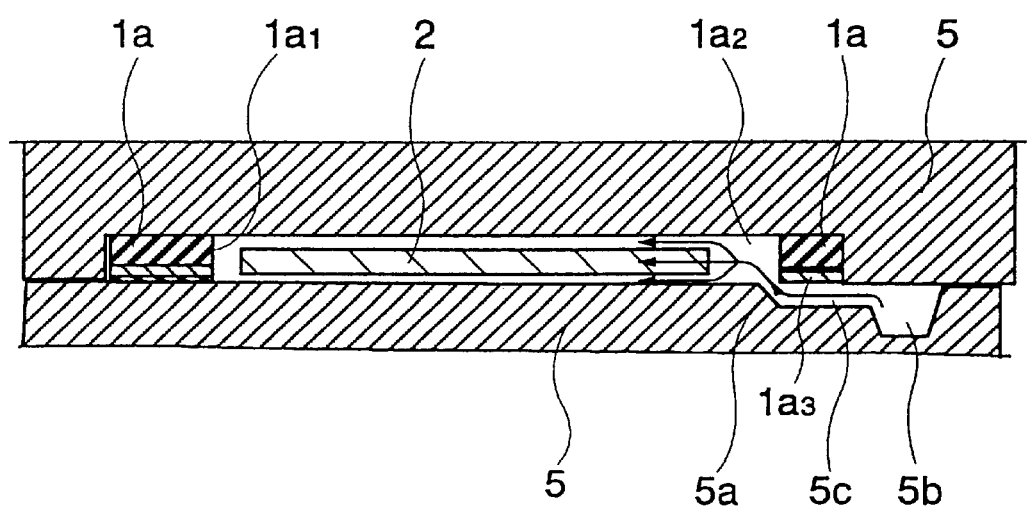
FIG. 3 is a sectional diagram of the semiconductor device of FIG. 1 at a process step of seal resin fabrication.

Firstly, a structure of a semiconductor device in accordance with a first embodiment of this invention will be explained in conjunction with FIGS. 1 to 3. Note that FIG. 1 is a sectional view taken along line I—I of FIG. 2, whereas FIG. 3 is a sectional view at line III—III of FIG. 2 within a resin sealing metal mold structure. In FIG. 2 a solder resist and sealing resin are not illustrated for purposes of convenience in illustration only.

The semiconductor device of the first embodiment is one that is adaptable for use with a semiconductor device as built in electronic equipment—such as computers, portable or mobile radiotelephone handsets, video cameras or the like—or integrated circuit (IC) cards or memory cards; for example, the semiconductor device is arranged to have a tape carrier package (TCP) structure which includes a semiconductor chip 2 disposed within a device hole 1a1 of a tape carrier 1, wherein the semiconductor chip 2 is sealed by a seal resin material 3 while causing electrodes of the semiconductor chip 2 to be externally drawn via bump electrodes 4 associated therewith.

The tape carrier 1 has a tape base member 1a, a plurality of leads 1c bonded by adhesive 1b to one surface of the tape base 1a, and a solder resist 1d for use in coating those portions of such leads 1c which are exposed from the seal resin 3. The thickness of this tape carrier 1 as a whole may be represented by a total sum of the thicknesses of constituent parts including the tape base 1a, which may typically be 167 micrometers (mm) or more or less, although this value is variable among electronic products.

The tape base 1a is made of polyimide resin or other similar suitable materials, which measures 100 mm in thickness, by way of example. Tape base 1a has a device hole 1a1 which is of planar rectangular shape and is centrally defined therein. This device hole 1a1 is formed to have a slightly larger size than the chip size thereby allowing the semiconductor chip 2 to be received or housed therein.

Also in the tape base 1a, a passage or inlet port 1a2 for use in injecting resin is formed on the side of one shorter side of the device hole 1a1, which port 1a2 extends from the device hole 1a1 toward one shorter side of the outer periphery of tape base 1a. The resin injection port 1a2 is formed into a T-like planar shape, for example. As shown in FIG. 3, this resin injection port 1a2 is an opening for coupling between a gate 5a of a metal molding-die tool 5 and the device hole 1a1 of the tape base 1a to thereby permit seal resin injected into the gate 5a to be introduced into the device hole 1a1 (cavity) through this port 1a2. In other words, the resin injection port 1a2 functions as part of the gate during resin sealing processes. Whereby, it is possible to inject the seal resin 3 so that it uniformly covers both the principal surface and back surface of the semiconductor chip 2, which in turn makes it possible to greatly reduce the risk that voids and/or traps are formed inside of such seal resin 3. Note here that an arrow shown in FIG. 3 designates the flow-in direction of seal resin 3. Also note that the reference character "5b" denotes a runner, whereas 5c indicates a sub-runner of the metal mold.

In addition, an Au-electroplated copper thin-film layer (metal layer) 1a3, for example, is formed at a portion (hatched in FIG. 2) at which the seal resin makes contact during resin sealing processes in close proximity to the seal resin injection port 1a2 on the tape carrier 1. The copper thin-film layer 1a3 has been formed by patterning of a copper thin film used for fabrication of the leads 1c simultaneously during formation of such leads 1c; and, the electro-plating process is also applied thereto simultaneously when plating leads 1c. The plated copper thin-film layer 1a3 is formed at a specified location facing the sub-runner 5c of the molding die 5 when the tape carrier 1 is disposed in the molding die 5.

This is done for the reason which follows. While such electroplated-portions are portions from which residual resin components finally residing on the sub-runner 5c are peeled off for removal, if no electroplating is applied to such portions, the adhesive strength or adhesivity of residual resin components on such portions with the tape carrier 1 can increase resulting in inability to perform any successful peel-off removal of the tape carrier 1 from the metal mold. In summary, according to the first illustrative embodiment, provision of the plated copper thin-film layer 1a3 may serve to reduce the adhesivity between the residual resin at the sub-runner 5c and the tape carrier 1, which in turn makes it possible to facilitate peeloff separation between the sub-runner 5c's resin and the tape carrier 1.

The tape base 1a has one surface on which multiple leads 1c are adhered by adhesive 1b that measures 12 $\mu$m in thickness, for example. The leads 1c are made of copper (Cu) formed to a thickness of approximately 35 $\mu$m, for example. One end of each lead 1c is projected into the device hole 1a1, wherein the distal end surface of the projected portion is electroplated with gold (Au) by way of example. The distal end of each lead 1c is electrically connected via a bump electrode 2a to the semiconductor chip 2. This bump electrode 2a is made for example of Au as will be discussed later in the description. Accordingly, the bump electrode 2a and its associated lead 1c are in contact with each other by means of an Au—Au junction or the like. Note that the bump electrode 2a is formed at the individual one of a plurality of bonding pads 2b disposed on the principal surface of the semiconductor chip 2 as will be discussed later, through which bump the intended electrical connection is made with respect to semiconductor integrated circuitry on the semiconductor chip 2.

In addition, a bump undercoat-layer pattern 1c1 is formed at a portion located midway between the projection end of lead 1c and the other end, which is adhered to the tape base 1a. The bump underlayer pattern 1c1 is formed so that it is greater in width than the normal region of lead 1c with the above-noted bump electrode 4 being in contact with the upper surface thereof. More specifically, an electrode of the semiconductor chip 2 is electrically connected via the lead 1c to the bump electrode 4, and is extended toward the outside via this bump electrode 4. And, this semiconductor device is mounted for assembly on a mount substrate—such as a printed circuit board including a so-called mother board-with the bump electrode 4 located therebetween for electrical connection with the mounting board's leads. Additionally, the bump electrode 4 is made for example of a plumbum (Pb)-stannum (Sn) alloy.

Those surface portions of leads 1c excluding such a bump underlayer pattern 1c1 and the surfaces of adhesive 1b are coated with the solder resist 1d. The solder resist 1d is about 20 $\mu$m in thickness, by way of example. In the first illustrative embodiment, the coat layer of lead 1c is made of the solder resist 1d thereby enabling miniaturization of the diameter of a connection hole for exposure of the bump underlayer pattern 1c1.

On the other hand, the semiconductor chip 2 consists of a small piece of silicon (Si) single-crystal of rectangular planar shape for example, which has its principal surface on which predesigned semiconductor integrated circuitry is formed. In the first embodiment, the semiconductor chip 2 is smaller in thickness than the tape base 1a of tape carrier 1. The chip thickness is approximately 50 μm for example. This thickness value of the semiconductor chip 2 has been established by applying polishing processes such as for example spin-etching techniques after having abraded the bottom surface of a semiconductor wafer. This makes it possible for the semiconductor chip 2 to become thinner down to 20 to 30 μm as an example. In addition, it is also possible to smoothen the back surface of the semiconductor chip 2, which in turn enables the semiconductor chip 2 to offer anti-crackable structure with enhanced robustness against bending stresses applied thereto.

In addition, the plural bonding pads 2b stated supra are disposed in a region near the longer sides on the principal surface of the semiconductor chip 2. The bonding pads 2b are the electrodes that are used for permitting outward extension of electrodes of the semiconductor integrated circuit discussed above toward the outside of the semiconductor chip 2, which are made for example of aluminum (Al) or Al alloys. Each bonding pad 2b has an upper surface on which a corresponding one of the lead-connecting bump electrodes 2a is formed.

The bump electrodes 2a have been formed by wire bump methods prior to completion of the spin etching process. More specifically, the bump electrodes 2a may be formed as follows. After having coupled bonding wires to the bonding pads 2b, using wire bonding methods, those fine-line portions other than spherical or ball-like portions residing on the bonding wires' contact portions are cut and removed away while allowing the balls to be left on the pads 2b. The bump electrodes 2a are electrically connected to the ends of the TCP's leads 1c in the way stated previously. Additionally, the height of each bump electrode 2a obtained after the inner-lead bonding process is about 21.5 μm as an example.

Incidentally, in the first embodiment, the semiconductor chip 2 is coated with the seal resin 3 both on the principal surface and on the bottom or back surface thereof. And, a layout position of the semiconductor chip 2 in a direction along the thickness of the tape base 1a is designed so that the stress neutral plane "A" of the overall TCP is substantially identical to the stress neutral plane of the semiconductor chip 2. In other words, the semiconductor chip 2 is placed at a specific location whereat any stress being applied from the TCP is minimal. With such an arrangement, even when an external force is applied resulting in deformation of the TCP as a whole, the stress the semiconductor chip 2 might receive remains small while at the same time enabling suppression of warp of the entire TCP due to bimetal effects, which in turn makes it possible to noticeably reduce the risk of chip cracks as well as the rate of occurrence of connection deficiency or failure during on-board mount installation of the semiconductor device.

It is noted that the stress neutral plane A is a plane parallel to the principal surface of the semiconductor chip 2, which is a specific plane on which the stress applied to the semiconductor chip 2 becomes neutral in the direction along the thickness of the semiconductor chip 2. In FIG. 1 the stress neutral plane A is shown by a line segment, which means that it is a plane parallel to the principle surface of the semiconductor chip 2 at those locations on such line.

The seal resin 3 for use in sealing the semiconductor chip 2 is made of an epoxy-based resin material for example, which is formed such that its upper and lower surfaces are coincident in level with—i.e. coplanar with—the upper and lower surfaces of the tape carrier 1, respectively. To be more specific, the thickness D1 of the seal resin 3 is equal to the thickness D2 of the tape carrier 1. Whereby, it becomes possible to let the total thickness of the TCP be the thickness of the tape carrier 1. It is thus possible to obtain a thickness-reduced or "thinner" semiconductor device of TCP structure. Additionally, the seal resin 3 has been fabricated by transfer mold or other methods.

An explanation will next be given of a manufacturing method of the semiconductor device in accordance with the first embodiment with reference to FIG. 4 up to and including FIG. 10.

First, as shown in FIG. 4, a device hole 1a1 is formed at a prespecified part of a belt-like tape base 1a with adhesive 1b applied to its one surface.

Subsequently, Cu, for example, is adhered to one surface of the tape base 1a by use of the adhesive 1b bonded to the one surface; thereafter, the Cu thin film is patterned by etching techniques or the like to thereby form a plurality of leads 1c as shown in FIG. 5. In this case a bump underlayer pattern 1c1 is formed at part of the leads 1c while simultaneously forming the Cu thin-film layer 1c3 stated above (see FIG. 2).

Thereafter, as shown in FIG. 6, a solder resist 1d is fabricated on one surface of the tape base 1a thus allowing the bump underlayer pattern 1c1 and inner lead 1c to be exposed to the atmosphere. Then, the solder resist 1d is used as a mask to effectuate Au electroplating with respect to those portions of leads 1c exposed from the solder resist 1d. At this process step, Au plating, for example, is also effected to the surface of bump underlayer pattern 1c1 along with the surface of the copper thin-film layer 1c3 (see FIG. 2). Whereby, the tape carrier 1 is manufactured.

Subsequently, after placing the semiconductor chip 2 within the device hole 1a1 of the tape base 1a and then performing position alignment between the bump electrodes 2a and leads 1c of the semiconductor chip 2, the bump electrodes 2a are bonded to the leads 1c by simultaneous or "all-at-once" inner lead bonding methods as shown in FIG. 7.

Figure 8:
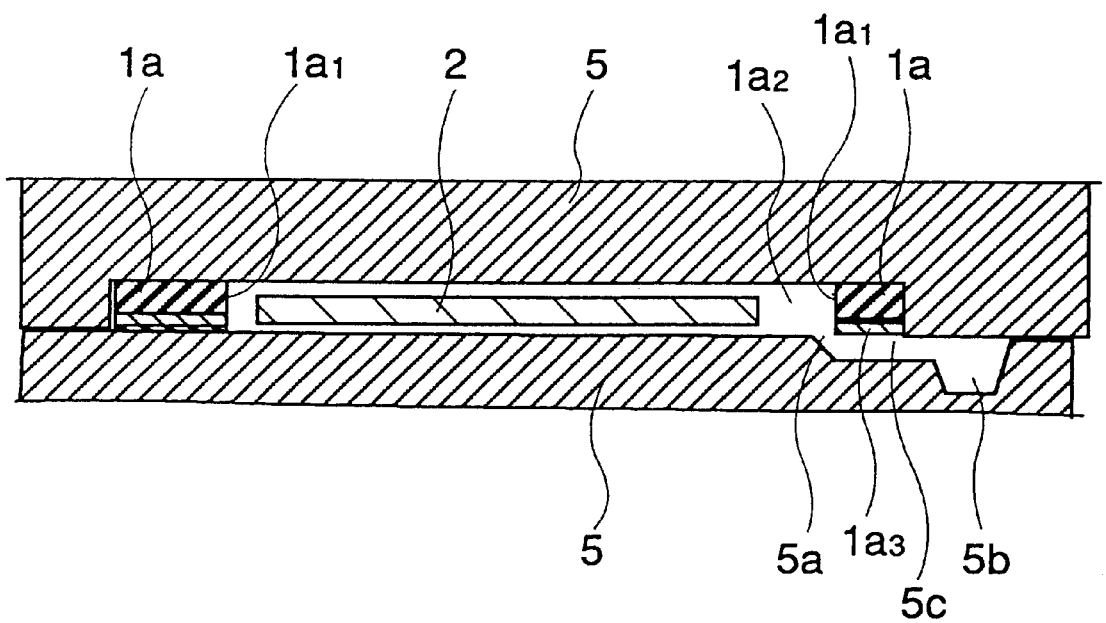

Thereafter, the tape carrier 1 mounting thereon the semiconductor chip 2 is placed in a molding die 5 as shown in FIG. 8; and then, a molten seal resin material that has been fed into the runner 5b of molding die 5 is injected into the cavity by way of the sub-runner 5c, the gate 5a and the seal resin injection port 1a2 of the tape base 1a, which cavity is formed by the device hole 1a1 of the tape base 1a and the molding die 5. Additionally, air components or "bubbles" residing inside of the cavity are externally exhausted through an air vent which is provided on the seal resin flowout side in the molding die 5.

During this sealing process, in the first embodiment, provision of the passage port 1a2 for use in injecting seal resin may enable uniform flow of the seal resin 3 onto both the principal surface and the back surface of the semiconductor chip 2, which in turn makes it possible to suppress unwanted creation of voids or the like therein.

Then, the resultant resin-sealed TCP is taken out of the molding die 5. When this is done, in the first embodiment, the plating-treated copper thin-film layer 1a3 is formed at part of the tape base 1a which faces the sub-runner 5c thereby enabling reduction of adhesivity of resin residing within the sub-runner at such part, which in turn makes it possible to readily remove away residual resin components in the sub-runner which can attach to such part.

Figure 9:
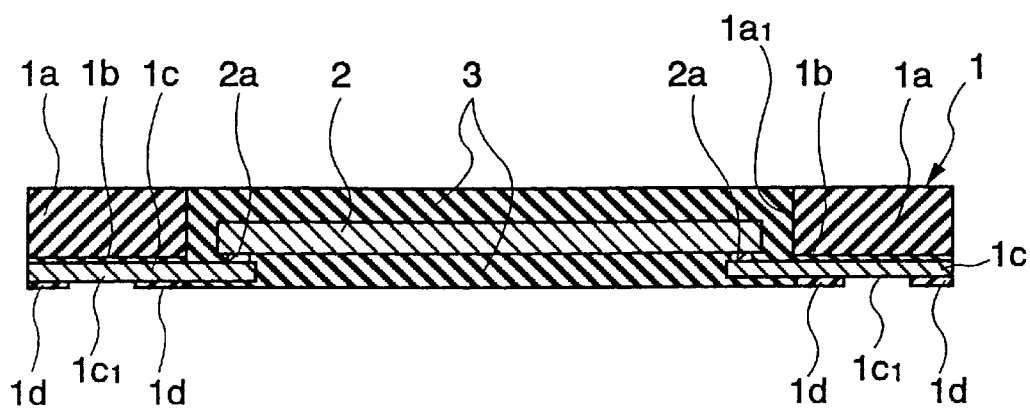

In this way the intended TCP is manufactured through sealing of the semiconductor chip 2 by use of the seal resin 3 as shown in FIG. 9. In the first embodiment, both of the principal surface and the back surface of the semiconductor chip 2 are coated with the seal resin 3. Note that the heights of the upper and lower surfaces of the seal resin 3 are identical to those of the upper and lower surfaces of tape carrier 1.

Figure 10:
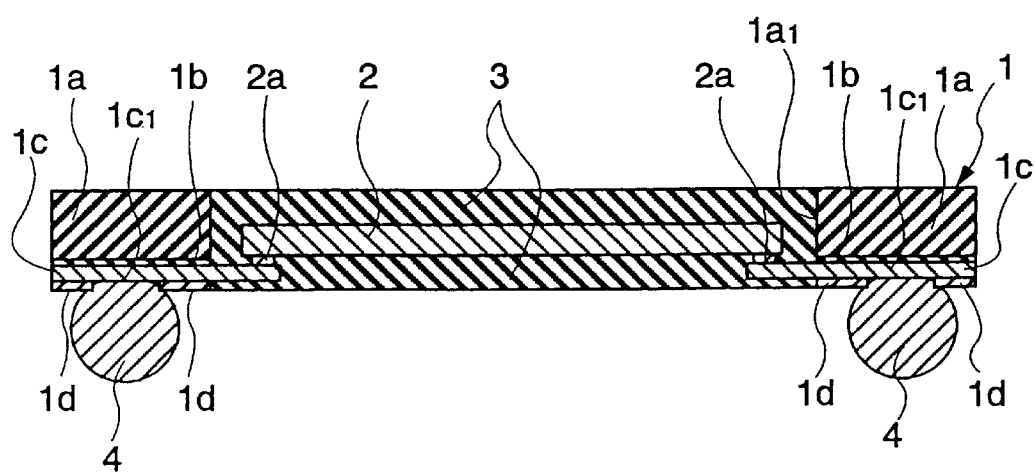

Thereafter, the resultant TCP is subject to aging processes and screening inspection procedures as well as cut-into-pieces processes; and then, as shown in FIG. 10, bump electrodes 4 made for example of a Pb—Sn alloy are allowed to contact the bump underlayer pattern 1c1 of leads 1c.

According to the first illustrative embodiment obtainable in the way stated above, the following technical effects and advantages are achievable .

(1) Allowing the seal resin 3 to coat both the principal surface and back surface of the semiconductor chip 2 may reduce the stress the semiconductor chip 2 can receive from its principal surface and back surface. Especially, setting the location of the semiconductor chip 2 to ensure that the stress neutral plane A of the TCP as a whole is nearly equal to the stress neutral plane of the semiconductor chip may enable the semiconductor chip 2 to be disposed at an "ideal" position whereat any stress received from the TCP remains minimal, to thereby guarantee that the stress the semiconductor chip 2 might receive is small even upon occurrence of deformation of the TCP as a whole due to application of an external force, while successfully suppressing warping of the entire TCP due to bimetal effects, thus making it possible to greatly reduce the risk of chip cracks as well as the rate of occurrence of connection deficiency or failure during on-board mount installation of the semiconductor device.

(2) Providing the tape base 1a with the passage or port 1a2 for use in injecting seal resin which functions as a gate during resin 3 sealing processes may enable uniform injection of the seal resin onto both the principal surface and the rear surface of the semiconductor chip 2, which in turn makes it possible to suppress unwanted creation of voids and/or traps in such seal resin 3.

(3) Provision of the plated copper thin-film layer 1a3 at a specified part of the tape base 1a whereat the seal resin can contact during resin seal processes may reduce the adhesivity between residual resin 3 at such part and at the tape carrier 1, which in turn makes it possible to facilitate peeloff removal of residual resin components in the sub-runner during separation of the TCP from the sub-runner after completion of the resin sealing process from the tape carrier 1.

4) Effectuation of polishing the back surface of the semiconductor chip 2 by spin-etching techniques or the like makes it possible for the semiconductor chip 2 to become thinned down to 20 to 30 μm, for example. In addition, it is also possible to smoothen the back surface of the semiconductor chip 2, which in turn enables the semiconductor chip 2 to offer an anti-crackable structure with enhanced robustness against any bending stress applied thereto.

(5) By performing machining to let the thickness D1 of the seal resin 3 be equal to the thickness D2 of the tape carrier 1, it becomes possible to allow the total thickness of the TCP to be equal to the thickness of the tape carrier 1. It is thus possible to obtain a thickness-reduced or "thinner" semiconductor device of TCP structure than ever.

Figure 11:
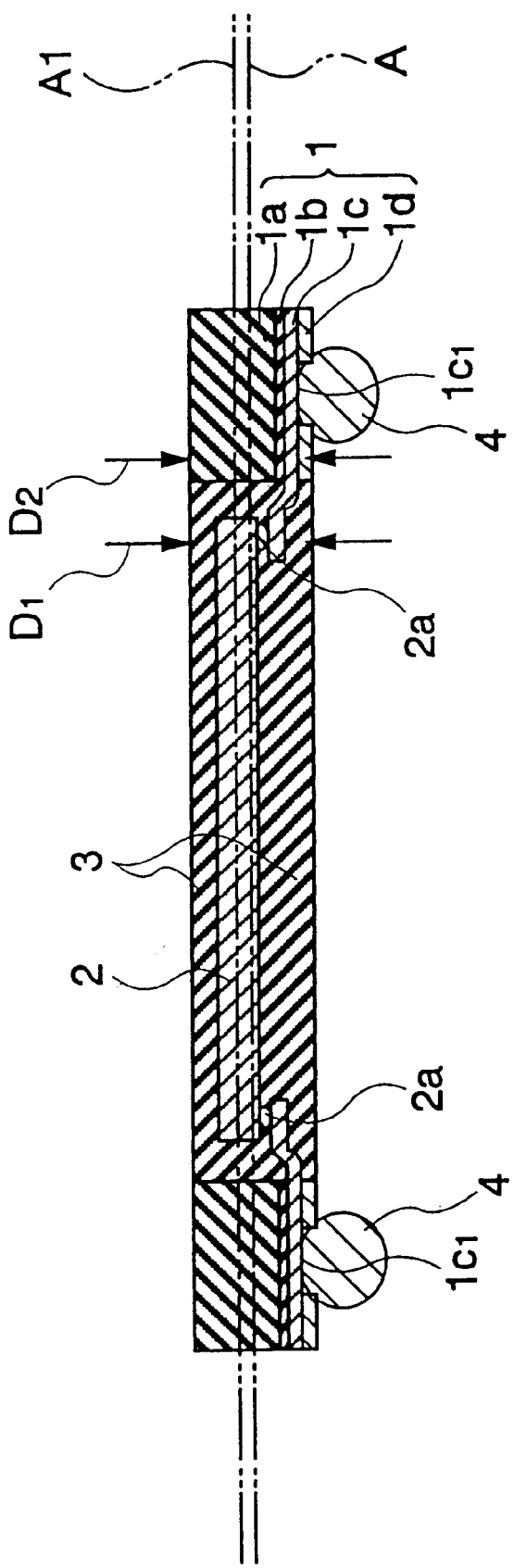
FIG. 11 depicts a cross-sectional view of a semiconductor device in accordance with another embodiment of this invention.

A semiconductor device in accordance with another embodiment of the present invention will next be explained with reference to FIG. 11.

The semiconductor device of the second embodiment may be the same in basic structure as that of the first embodiment. A significant difference is that the inner lead portion of a lead 1c is bent in the direction along its thickness causing the inner lead to contact the bump electrode 2a of the semiconductor chip 2 while it is offset by about 50 μm along the thickness direction thereof, which results in the stress neutral plane A1 of the semiconductor chip 2 being slightly deviated from the stress neutral plane A of the entire TCP structure.

Note however that from a viewpoint of retaining reliability, relative deviation between the position of the entire TCP's stress neutral plane A and the stress neutral plane A1 of the semiconductor chip 2 is designed to fall within an allowable range or tolerance zone of ±60 μm. In the second embodiment such deviation is set at 47.5 μm, more or less.

Occurrence of the deviation between the stress neutral planes A, A1 resulting from bending of lead 1c is due to a difference in thickness among constituent components including, but not limited to, the tape base 1a, height differences of the bump electrodes 2a after completion of the inner-lead bonding processes, differences in height setup values of a heater tool for use during bonding, and others. In the second embodiment the total thickness of the tape carrier 1 is approximately 250 μm by way of example; the thickness of the tape base 1a is about 150 μm for example;.the thickness of the adhesive 1b is about 20 μm for instance; the thickness of lead 1c is about 35 μm for instance; the thickness of solder resist 1d is about 25 μm as an example; and, the height of bump electrode 4a after execution of inner-lead bonding is about 20 μm for example.

Another difference of the second embodiment over the first embodiment is that Sn-plating, for example, is applied to the end of lead 1c, which end is in turn in contact with its associative bump electrode 2a that is made of Au. Accordingly, the lead 1c and bump electrode 2a are in contact together via an Au—Sn eutectic junction.

Incidentally, as an application of the second embodiment, the following is also employable. In cases where the stress neutral plane A1 of the semiconductor chip 2 and the stress neutral plane A of the TCP as a whole are slightly deviated from each other due to any possible thickness differences among respective constituent parts or components of the TCP, such deviation is corrected by adjustment of the bending amount of the lead 1c.

More specifically, the position of the semiconductor chip 2 in the direction along the thickness of the tape base 1a may be set by changing the amount of bend of the lead 1c in a way such that the stress neutral plane A1 of the semiconductor chip 2 becomes identical to the entire TCP's stress neutral plane A. With such an arrangement, even where the TCP's respective components vary in size or otherwise, it becomes possible to set the semiconductor chip 2 at an optimal location at which the stress being applied to the semiconductor chip 2 becomes minimized, in a way responsive to such component size variations.

Figure 12:
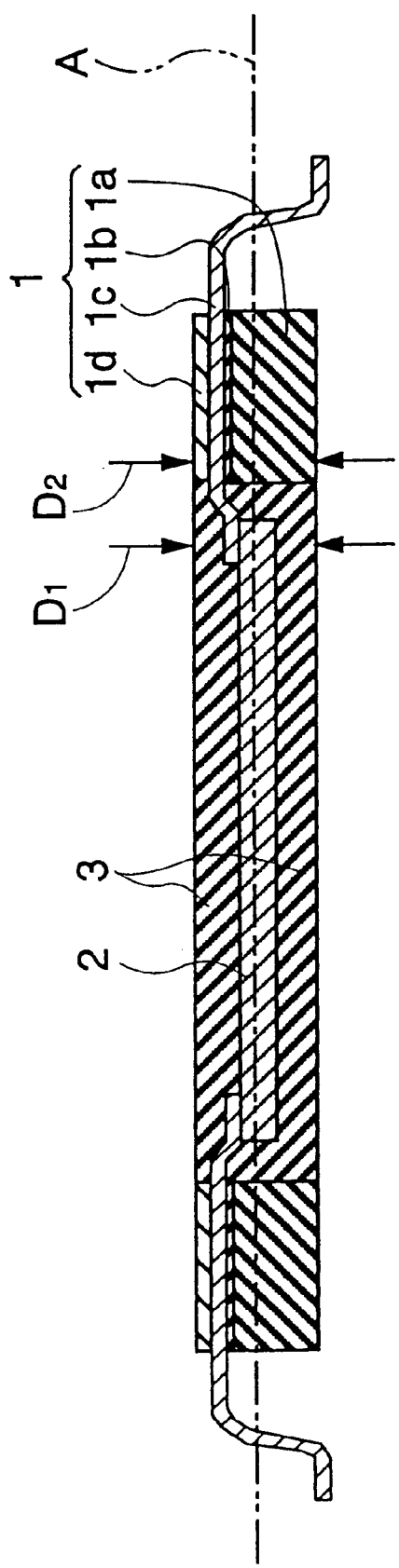
FIG. 12 depicts in cross-section a semiconductor device in accordance with another embodiment of the invention.

A semiconductor device in accordance with another embodiment of the instant invention will be described with reference to FIG. 12.

The semiconductor device of the third embodiment is generally similar in structure to the embodiment discussed above. Some significant differences therefrom are as follows.

A first difference lies in the fact that the lead 1c is bent in the direction along its thickness and is directly in contact with its associated bonding pad. The lead 1c has its end surface which has been subject to Au electroplating treatment for example and is coupled by single-point ultrasonic thermo-compression bonding methods to its associated bonding pad made of for example aluminum (Al) or the like.

A second difference is that the other end of lead 1c is designed to extend from the outer periphery of the tape base 1a so as to have a projected portion of "gull-wing" shape. In this case, unlike the first embodiment using the external terminal as the bump electrode, it becomes possible to lower the resultant parts mount/assembly height.

A semiconductor device in accordance with another embodiment of this invention will be explained with reference to FIG. 13.

Figure 13:
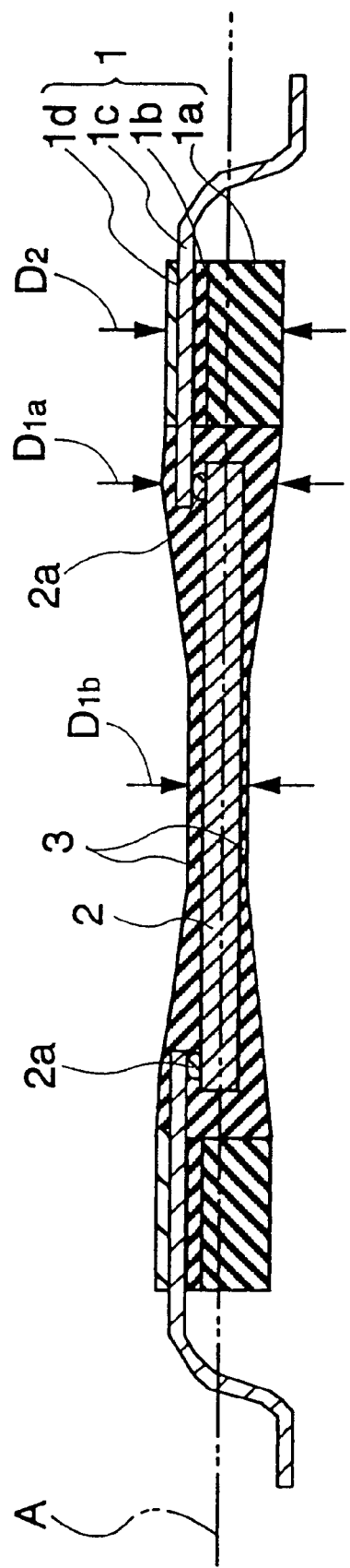
FIG. 13 shows in cross-section a semiconductor device in accordance with another embodiment of the invention.

The fourth embodiment is an example adaptable for use in a case where liquid resin is dropped down and then subject to thermal hardening to thereby form seal resin 3 as shown in FIG. 13, i.e. what is called the potting seal method.

The seal resin 3 used in this case also is arranged to coat both the principal surface and the back surface of the semiconductor chip 2 for causing the stress neutral planes A, A1 (see FIG. 11) to be identical to each other as discussed previously. This seal resin 3 has a thickness which is as large as the thickness D2 of the tape carrier 1 on the side of the outer periphery (thickness D1a) of the semiconductor chip 2, and which is gradually reduced or "tapered" toward the center of the semiconductor chip 2 (on the thickness D1b side).

In the fourth embodiment, in addition to the advantages obtained from the first embodiment stated above, there is obtainable an advantage that the intended resin sealing is achievable without having to use molding dies, which may in turn make it possible to readily seal the semiconductor chip 2 when compared to the cases of said first to third embodiments.

A semiconductor device in accordance with another embodiment of the invention will be explained with reference to FIGS. 14–21.

Figure 14:
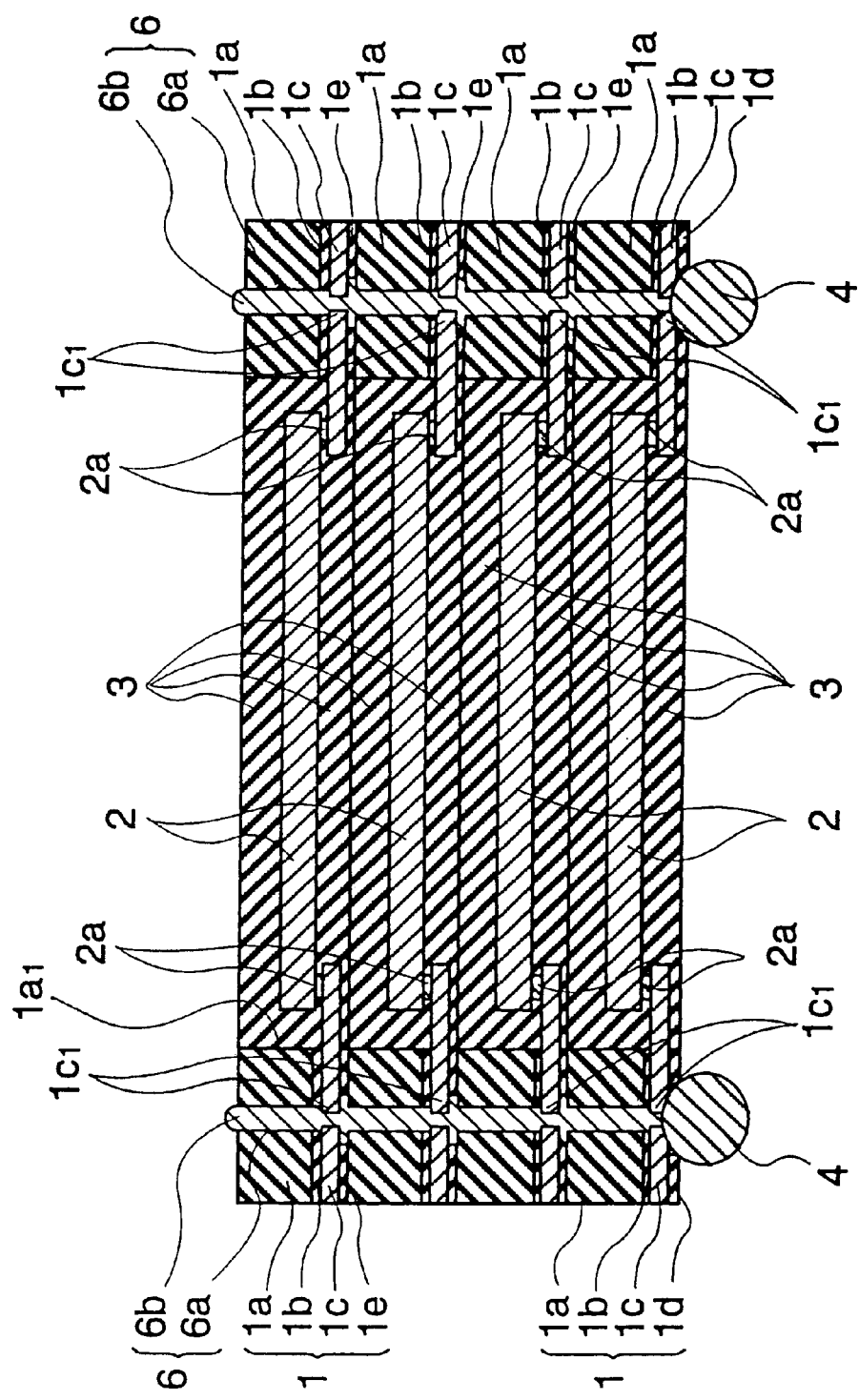
FIG. 14 shows a sectional view of a semiconductor device in accordance with another embodiment of the invention.
Figure 15:
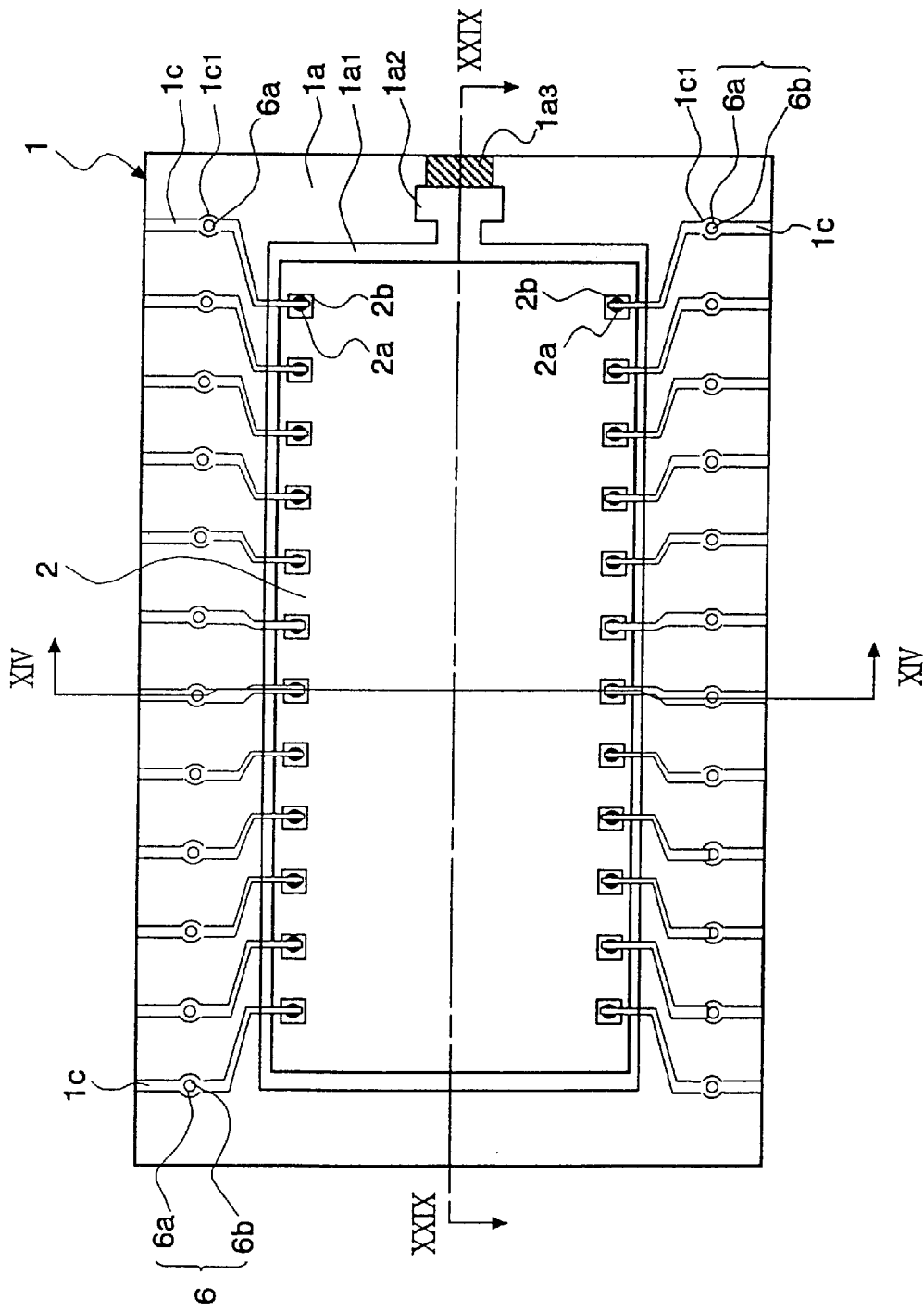
FIG. 15 is a plan view of the semiconductor device of FIG. 14.

A structure of the semiconductor device of the fifth embodiment will first be set forth in conjunction with FIGS. 14 and 15. Note that FIG. 14 is a sectional view taken along line XIV—XIV of FIG. 15. Also note that in FIG. 15 the solder resist and sealing resin are not depicted for purposes of convenience in illustration only.

In the fifth embodiment, a plurality of TCPs each similar in structure to the TCP that has been explained in the context of said first embodiment are laminated on one another to constitute a multi-layered TCP structure while causing the corresponding signal and power supply leads 1c of each TCP to be electrically connected together via connection sections 6, each penetrating a corresponding one of the tape bases 1a of the respective TCPs, which connection section 6 is in turn connected to a bump electrode 4 on the TCP bottom surface at the lowermost layer thereby permitting drawout toward the outside of the multilayer TCP.

Adjacent ones of the laminated unitary TCPs are bonded together by adhesive 1e. This adhesive 1e is a member for constituting part of the unitary TCP's tape carrier 1; for example, it is made of a thermally deformable polyimide resin material. Note however that the leads Ic of the lowermost unitary TCP are coated with a solder resist 1d.

The connection section 6 mentioned above is structured from a connection hole 6a and a conductor portion 6b embedded within the connection hole 6a. The connection hole 6a is formed at a selected position in the tape carrier 1 which corresponds to a bump underlayer pattern 1c1 of lead 1c.

It is noted that in the connection holes 6a, the connection hole 6a defined at the bump underlayer pattern 1c1 of lead 1c is formed so that the hole diameter thereof is smaller by approximately 50 μm, for example, than the hole diameter of the connection hole 6a as defined in the tape base 1a. This is in order to facilitate an arrangement such that part of the bump underlayer pattern 1c1 of lead 1c is projected into the inside of the connection hole 6a whereby the conductor portion 6b embedded within the connection hole 6a surely comes into contact with the lead 1c for achievement of a stable electrical connection with the lead 1c. The conductor portion 6b is made of a Pb—Sn alloy by way of example.

With such a multilayer TCP structure, it is possible to achieve high-density packaging of the semiconductor chips 2. One example is as follows. Assuming that eight TCPs, each 167 μm thick, are stacked in case a 64M-bit dynamic random-access memory (DRAM) for example is formed on one semiconductor chip 2, it becomes possible to obtain a multilayer TCP having a total storage capacity of 64 megabytes (MB) with the resulting total thickness measuring about 1.3 mm.

Next, a manufacturing method of the semiconductor device in accordance with the fifth embodiment will be explained in conjunction with FIGS. 16–21.

Figure 16:
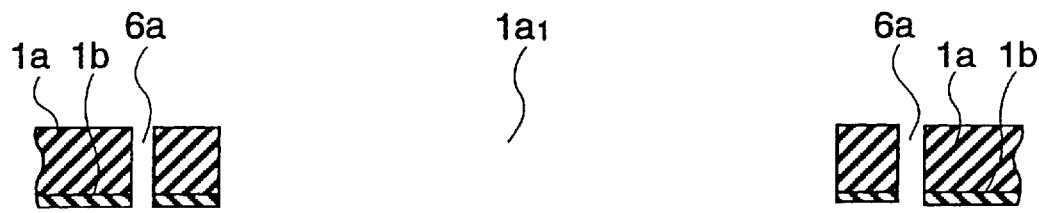
FIGS. 16 to 21 illustrate in cross-section some of the major steps in the manufacture of the semiconductor device of FIG. 14.

First, as shown in FIG. 16, by mechanical die-punching techniques, a device hole 1a1 and connection holes 6a are formed at selected portions of a tape base 1a with adhesive 1b bonded to its one surface.

Figure 17:
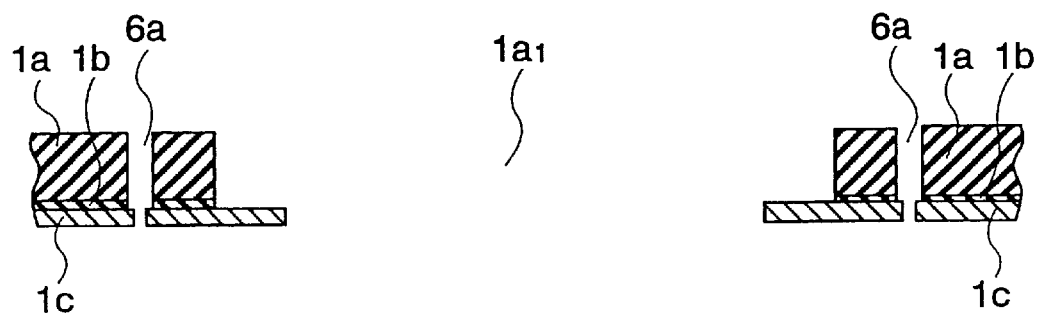

Subsequently, a Cu thin-film for example is bonded to one surface of the tape base 1a by using adhesive 1b attached thereto; and thereafter, the Cu thin film is patterned by etching methods or the like to thereby form a plurality of leads 1c while defining in the bump underlayer pattern 1c1 connection holes 6a which are smaller in diameter than the connection holes 6a at the tape base 1a portions as shown in FIG. 17.

Figure 18:
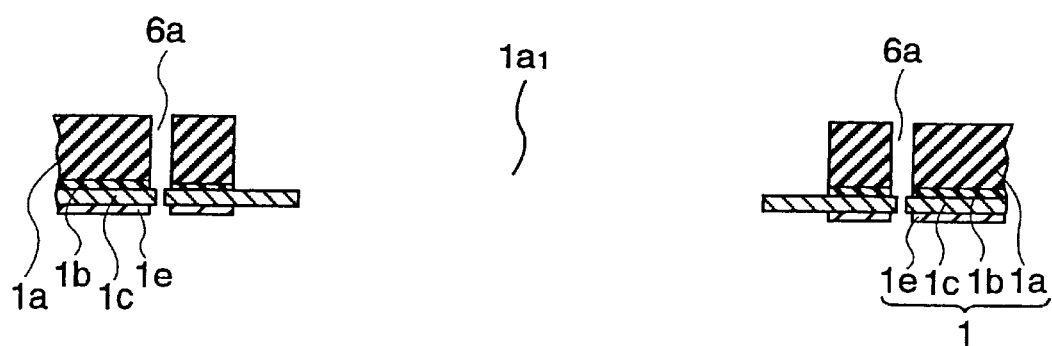

Thereafter, as shown in FIG. 18, adhesive 1e made of for example thermally deformable polyimide resin is provided on the side of the copper thin film; and then, part of such adhesive 1e is removed so that the bump underlayer pattern 1c1 portion of lead 1c and a projected inner lead portion 1c are exposed.

Next, the adhesive 1e is used as a mask to apply Au electroplating, for example, to those portions of leads 1c exposed from the adhesive 1e. The tape carrier 1 is thus manufactured.

Figure 19:
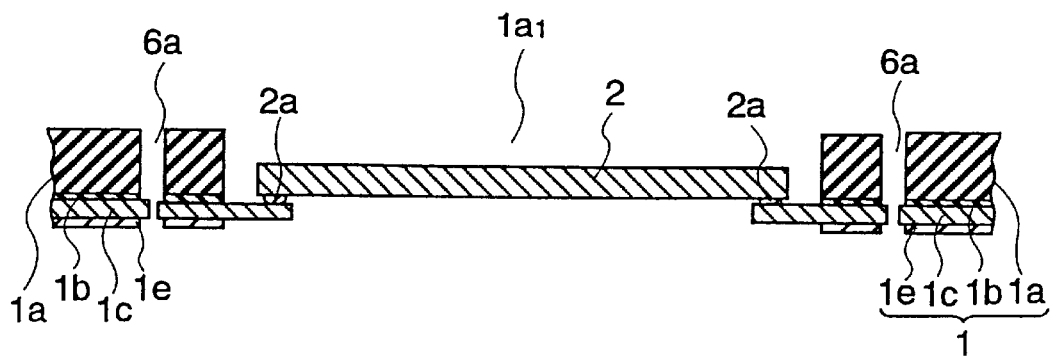

Subsequently, a semiconductor chip 2 is placed within the device hole 1a1 of the tape base 1a. Then, position alignment is performed between the bump electrodes 2a of the semiconductor chip 2 and leads 1c. Thereafter, the bump electrodes 2a are brought into contact with leads 1c by all-at-once inner-lead bonding techniques as shown in FIG. 19.

Thereafter, the tape carrier 1 mounting thereon the semiconductor chip 2 is placed within a molding die 5 as shown in FIG. 8; and then, a molten seal resin material, which has been fed to inside of a runner 5b of the molding die 5, is injected into a cavity as formed of the device hole 1a1 of tape base 1a and the molding die 5 through a sub-runner 5c and a gate 5a as well as a seal resin injection port 1a2 of the tape base la. Note that residual air in the cavity is externally exhausted through an air vent which is provided on the seal resin flowout side in the molding die 5. In this case, in the fifth embodiment also, provision of the seal resin injection port 1a2 enables a uniform flow of the seal resin onto both the principal surface and the back surface of the semiconductor chip 2, which in turn makes it possible to suppress unwanted creation of voids therein.

Then, the resin-sealed TCP is removed from the molding die 5. When this is done, in the fifth embodiment also, the plating-applied copper thin-film layer 1a3 is formed at part of the tape base 1a that faces the sub-runner 5c thus enabling reduction of adhesivity between a resin residing within the sub-runner 5c and the tape carrier 1, which in turn makes it possible to readily remove residual resin components in the sub-runner 5c which can attach to such part.

Figure 20:
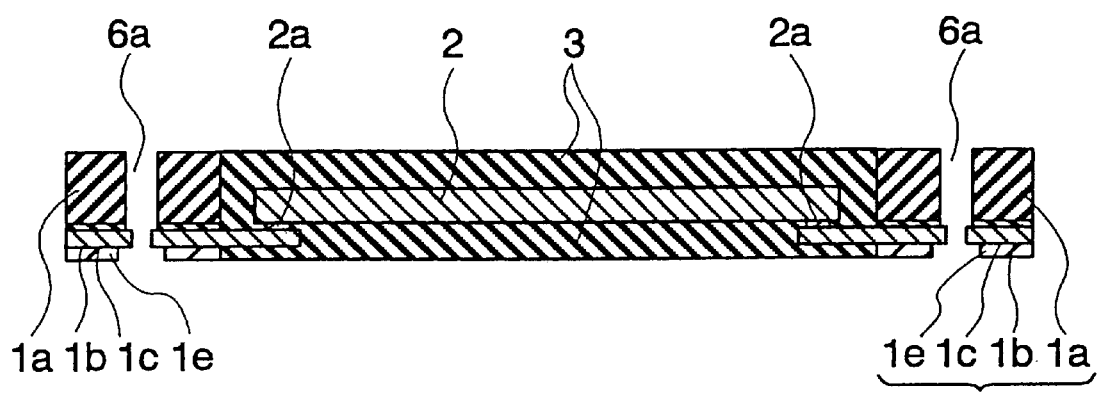

In this way the intended unitary TCP is manufactured through sealing of the semiconductor chip 2 by the seal resin 3 as shown in FIG. 20. In the fifth embodiment also, both of the principal surface and back surface of the semiconductor chip 2 are coated with the seal resin 3. Note that the upper and lower surfaces of the seal resin 3 are identical in height to the upper and lower surfaces of the tape carrier 1, respectively.

Figure 21:
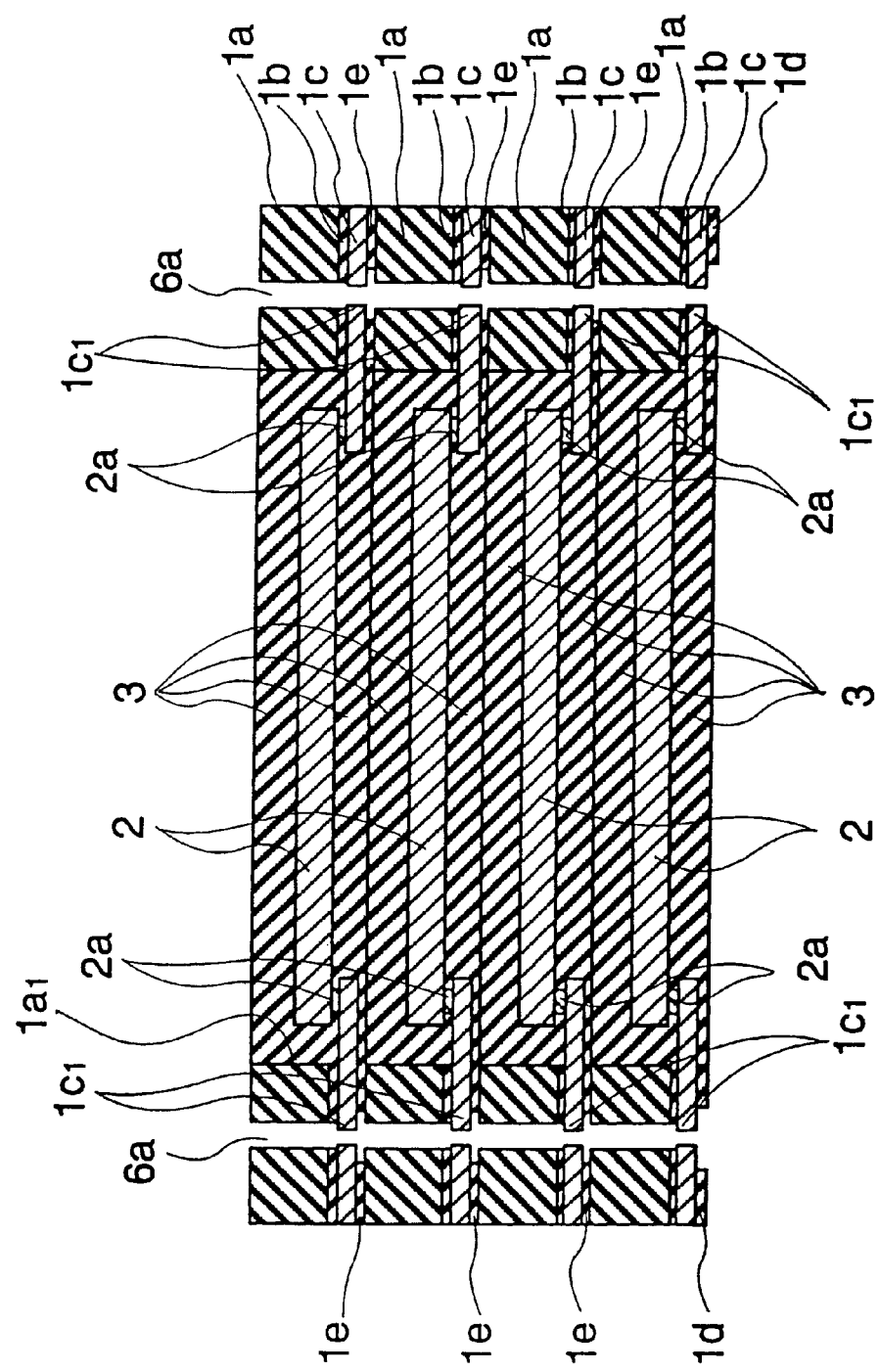

Subsequently, the resultant unitary TCP is subject to aging processes and screening inspection procedures as well as cut-into-pieces processes; and then, in the fifth embodiment, as shown in FIG. 21, a plurality of such unitary TCPs each of which has been manufactured in the way stated supra are laminated while arranging respective connection holes 6a to be identical in position to one another. Note that the unitary TCP's bottom surface at the lowermost layer is formed with a solder resist 1d rather than the adhesive 1e, which resist is formed in the state that the bump underlayer pattern 1c1 is exposed.

Thereafter, the adhesive 1e sandwiched between adjacent ones of the unitary TCPs is used to join the unitary TCPs together by thermo-compression methods thereby forming the intended multilayer TCP. In short, as multiple unitary TCPs are stacked or laminated on one another by use of the adhesive 1e that is formed during fabrication of a unitary TCP, it becomes possible to manufacture the multilayer TCP without increasing production process steps required.

Then, the inside of the connection holes 6a of the resultant multilayer TCP is filled with solder paste made of for example Pb—Sn or other similar suitable materials; and thereafter, reflow processing is effected thereto thereby forming the conductor portions 6b shown in FIG. 14 within the connection holes 6a. This makes it possible to electrically connect all of the laminated unitary TCPs together at one process step.

Subsequently, bump electrodes 4 made of Pb—Sn allow for example are brought into contact with the bump underlayer pattern 1c1 of leads 1c at the unitary TCP of the lowermost layer of the multilayer TCP, thereby completing the semiconductor device having a multilayer TCP structure according to the fifth embodiment.

According to the fifth embodiment obtained in the way stated above, the following technical effects and advantages are achievable in addition to those obtained in said first embodiment.

(1) Constituting the multilayer TCP by lamination of a plurality of thin unitary TCPs makes it possible to greatly improve the packaging density of semiconductor chips 2 while reducing the total thickness and dimensions of the multilayer TCP.

(2) By bonding together multiple unitary TCPs by using the adhesive 1e that constitutes part of a unitary TCP and is formed during formation of the unitary TCP, it becomes possible to manufacture the multilayer TCP without increasing the process steps required.

An explanation will next be given of another embodiment of the invention—sixth embodiment, which is substantially the same in structure as said fifth embodiment. Significant differences lie in manufacturing methodology; hence, the manufacturing method will be explained with reference to FIGS. 22–25.

Figure 22:
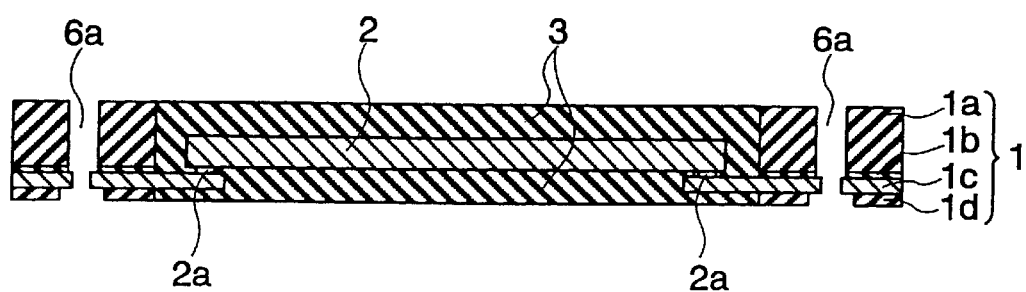
FIGS. 22–25 illustrate in cross-section some of the major steps in the manufacture o-f another semiconductor device of the invention.

First, as shown in FIG. 22, manufacture of a unitary TCP is effected in a way similar to that of said first embodiment. This unitary TCP has connection holes 6a which extend through a tape base 1a between its upper and lower surfaces.

Figure 23:
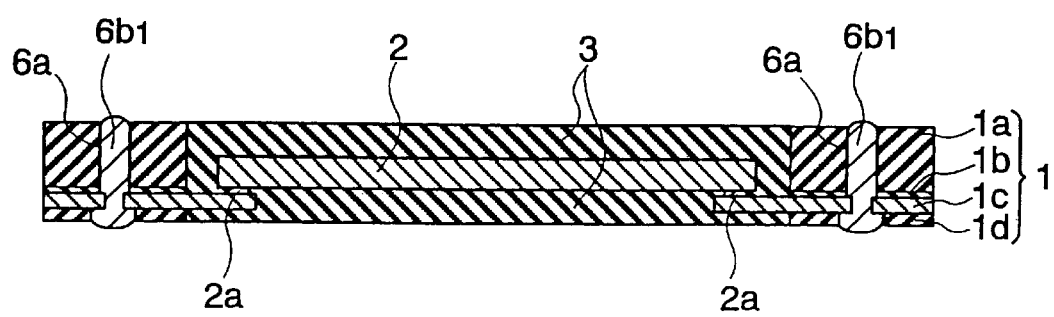

Subsequently, as shown in FIG. 23, print methods are used to form solder paste 6b1 made for example of Pb—Sn or the like within connection holes 6a of the unitary TCP. After having prepared a predetermined number of similar unitary TCPs, respective unitary TCPs are laminated on one another in the state that their connection holes 6a are aligned in position with one another. And, the laminated unitary TCPs are temporarily secured together by utilizing the adhesivity of the solder paste 6b1 within the connection holes 6a of respective unitary TCPs.

Thereafter, apply reflow processing to the resultant multiple unitary TCPs laminated and temporarily fixed together for fusion of the solder paste 6b1 within the connection holes 6a of respective unitary TCPs.

Figure 24:
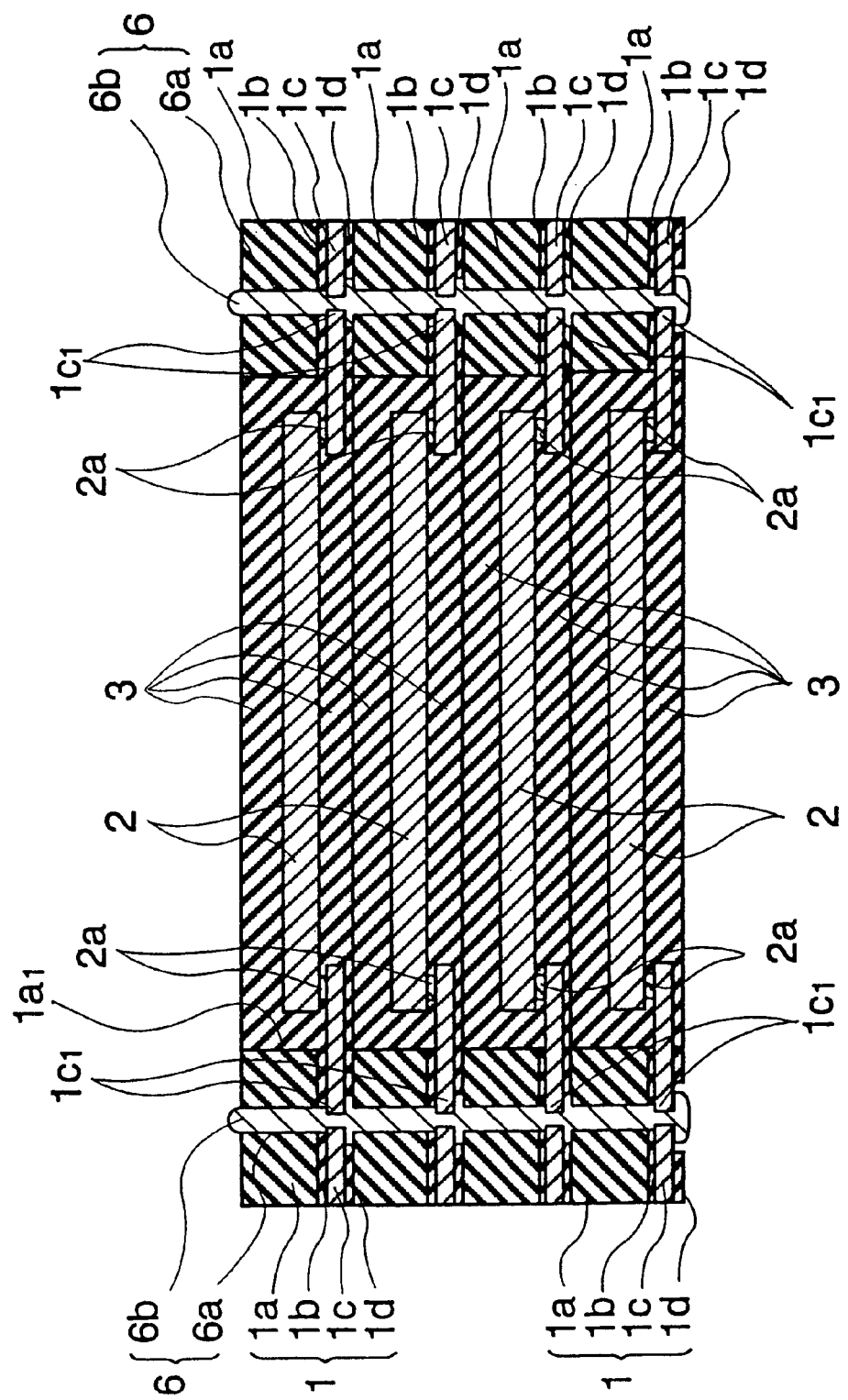
Figure 25:
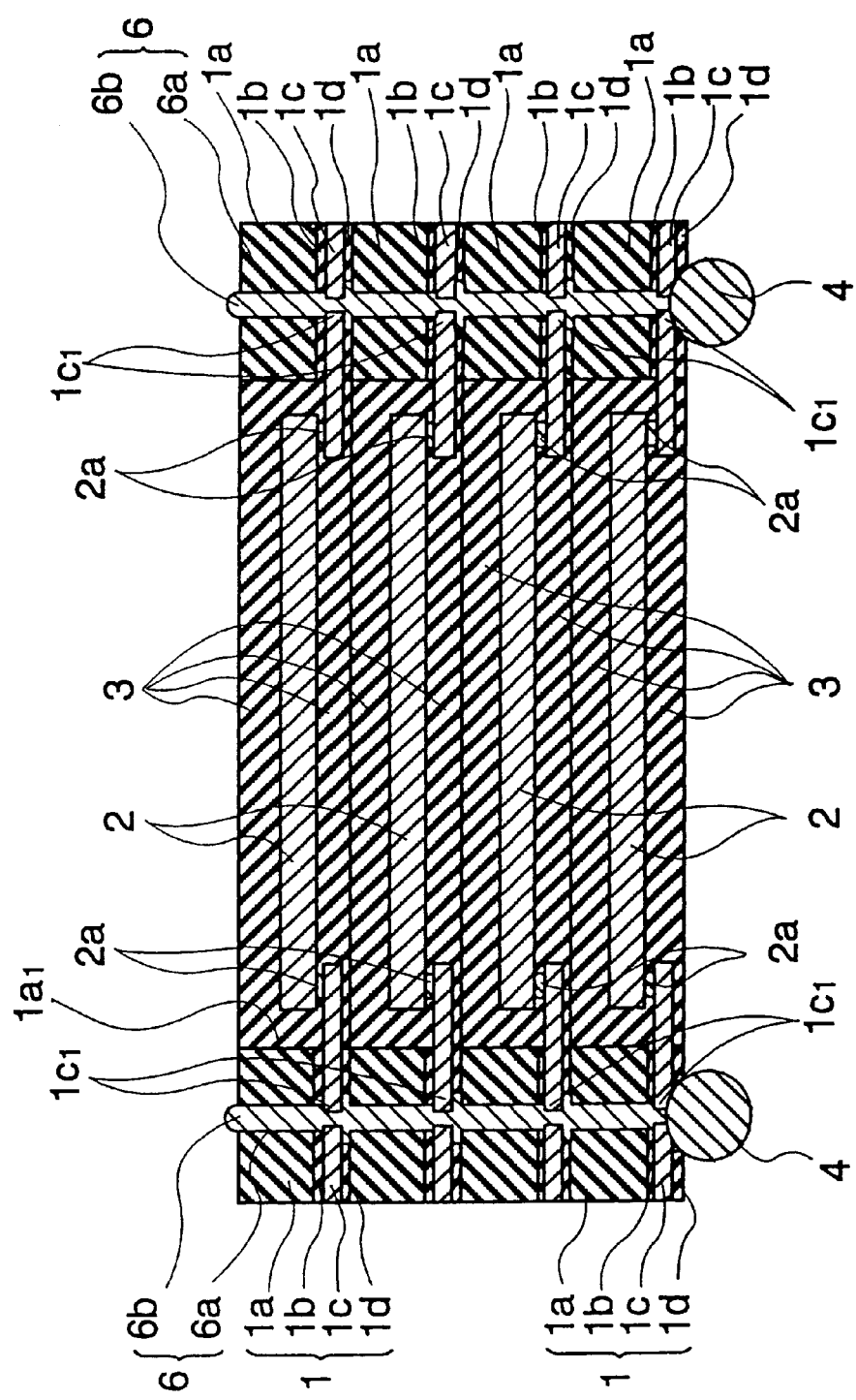

Whereby, conductor portions 6b are formed as shown in FIG. 24 while letting solder paste 6b1 within the connection holes 6a of respective unitary TCPs to be integral together, thereby to manufacture a multilayer TCP. As stated above, in the sixth embodiment, it is possible to bond the unitary TCPs together by the conductor portions 6b, rather than by means of adhesive.

Finally, as shown in FIG. 24, bump electrodes 4 made for example of Pb—Sn are brought into contact with the bump underlayer pattern 1c1 of leads 1c at the unitary TCP of the lowermost layer of the multilayer TCP to thereby manufacture a semiconductor device having a multilayer TCP structure according to the sixth embodiment.

A semiconductor device in accordance with another embodiment of the present invention will be described in conjunction with FIGS. 26–30.

First, a structure of the semiconductor device of the seventh embodiment will be explained with reference to FIG. 26. Note that the plan view of the semiconductor device of the seventh embodiment is the same as shown in FIG. 15 which has been used in the explanation of the fifth embodiment.

In the seventh embodiment, the seal resin 3 of the multilayer TCP is not separated in units of individual tape carriers 1, but is designed so that the resin is integrally molded to have a structure for sealing plural semiconductor chips 2 together. In addition, the plating-effected copper thin-film layer 1a3 mentioned above is formed in a limited region of the lowermost layer of tape base 1a in close proximity to the seal resin injection port 1a2 (the same position as said first and fifth embodiments). The remaining structure is the same as that of said fifth embodiment.

In the semiconductor device of the seventh embodiment as described above, since no gaps are formed between layers of seal resin 3 each for use in sealing the individual semiconductor chip 2, it becomes possible to improve the mechanical strength of a multilayer package when compared to said fifth embodiment while increasing the moisture vapor resistivity or humidity durability.

A manufacturing method of the semiconductor device of the seventh embodiment will be explained with reference to FIGS. 27–30. Note that the manufacturing steps for the tape carriers of the seventh embodiment are the same as those which have been explained above using FIGS. 16–18 in the context of said fifth embodiment, and any duplicative description will be eliminated herein. Also note that FIG. 29 is a sectional view taken along line XXIX—XXIX of FIG. 15.

Figure 27:
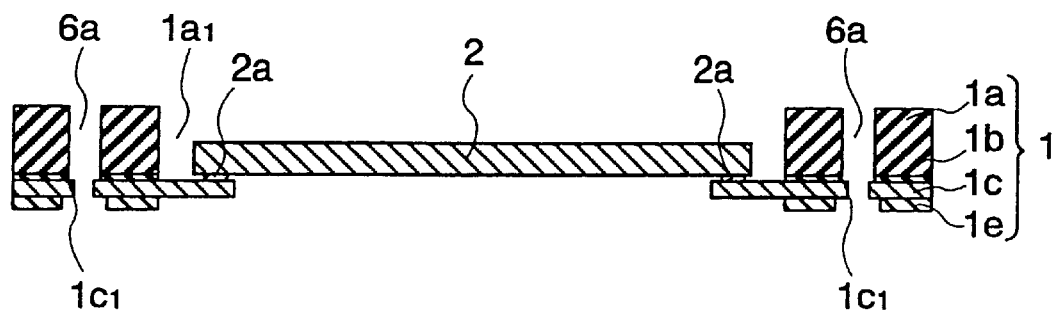
FIGS. 27–30 depict in cross-section some of the major steps in the manufacture of the semiconductor device of FIG. 26.

First, as shown in FIG. 27, a semiconductor chip 2 is placed within a device hole 1a1 of a tape base 1a; and then, after performing positional alignment between bump electrodes 2a of the semiconductor chip 2 and leads 1c, all-at-once inner lead bonding is effected to cause the bump electrodes 2a to contact the leads 1c.

Figure 28:
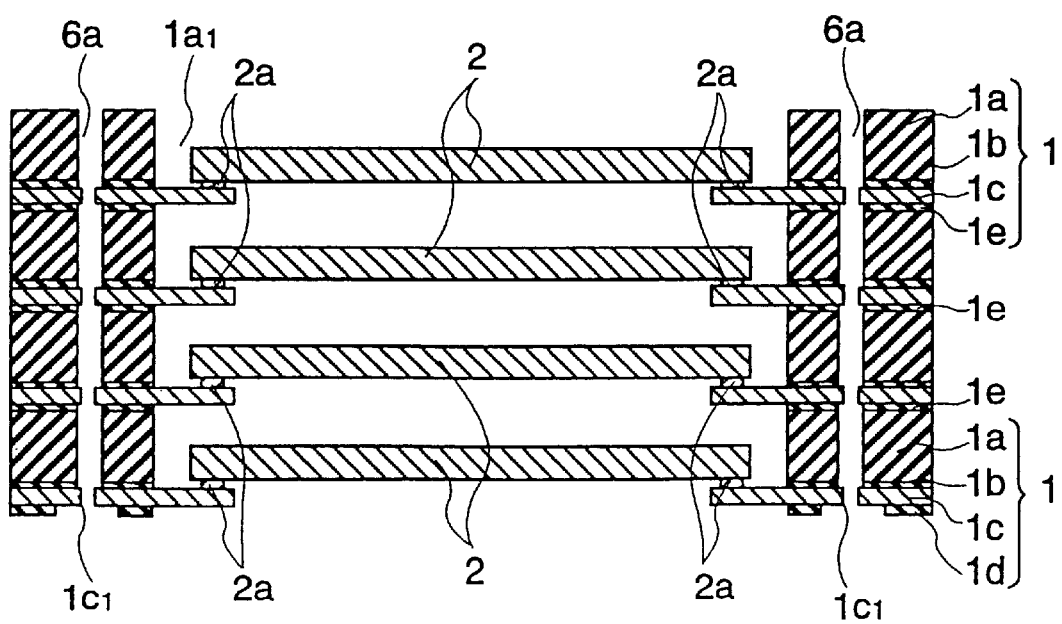
Figure 29:
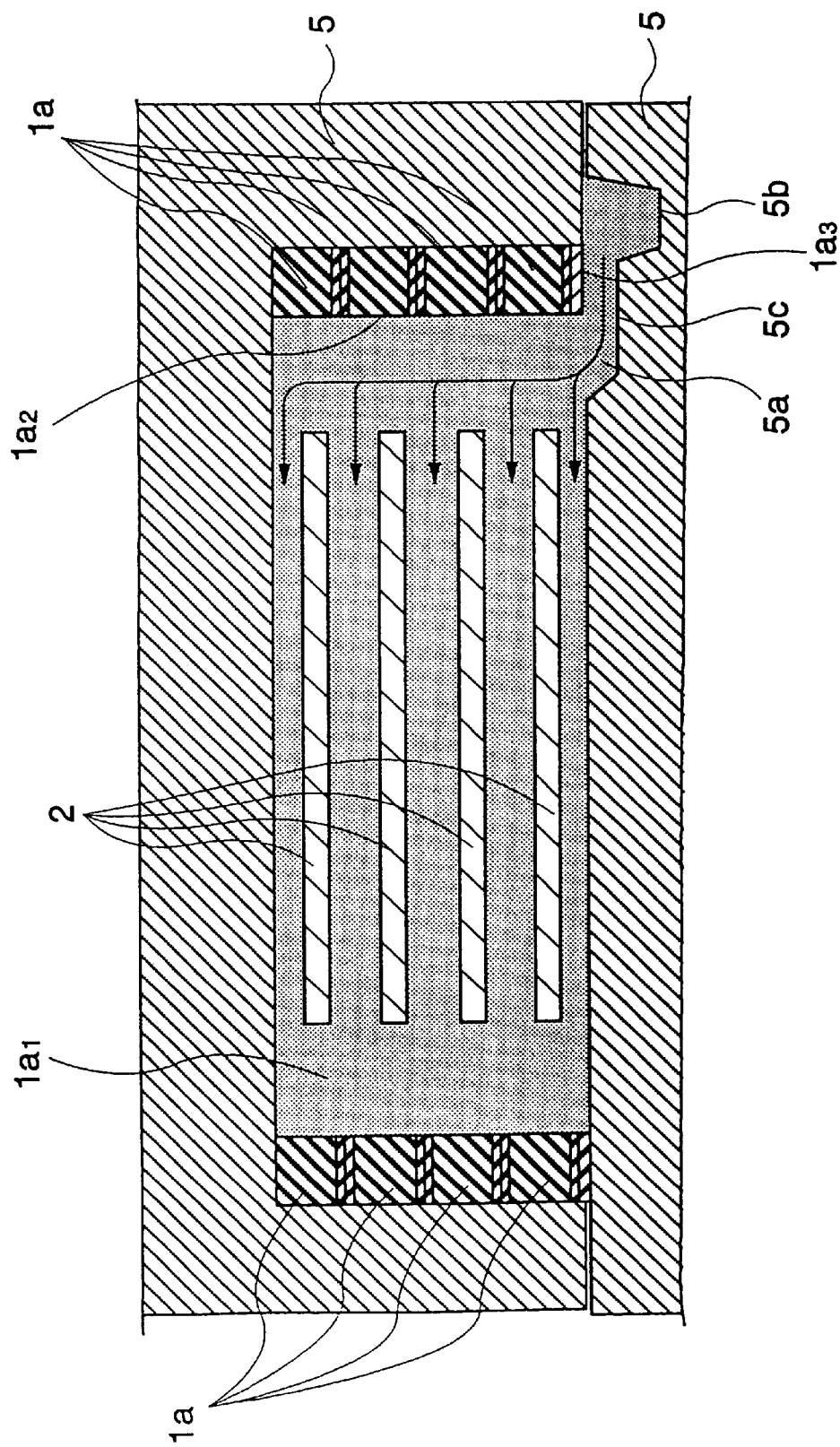

Subsequently, after lamination of a plurality of tape carriers 1 each mounting thereon its semiconductor chip 2 as shown in FIG. 28, the adhesive 1e is used between tape carriers 1 to temporarily secure resultant carriers together by a thermo-compression bonding method.

Here, in the seventh embodiment, seal resin injection ports 1a2 of the laminated tape bases 1a are identical in planar position in a manner such that each port is formed to extend in a direction along the thickness of the stacked tape bases 1a. A certain unitary TCP at the lowermost layer of the multilayer structure is formed with a solder resist 1d, rather than the adhesive 1e, while allowing the bump underlayer pattern 1c1 to be exposed therefrom.

Thereafter, as shown in FIG. 29, the stacked tape carriers 1 are placed within a molding die 5. This molding die 5 has a structure which enables simultaneous sealing of respective semiconductor chips 2 within the tape carriers 1 being laminated.

Then, a molten seal resin material, which has been supplied to the inside of a runner 5b of the molding die 5, is injected into a cavity formed by the device hole 1a1 of the tape base 1a and the molding die 5 by way of a sub-runner 5c and a gate 5a plus a seal resin injection port 1a2 of the tape base 1a. Note that the air residing within the cavity is externally exhausted through an air vent which is provided on the seal resin flowout side in the molding die 5.

In this case, in the seventh embodiment, it is possible to allow the molten seal resin as injected from the gate of the molding die 5 to flow uniformly onto the principal surface and the back surface of the semiconductor chip 2 through the seal resin injection port 1a2 extending in a direction along the thickness of the tape base 1a. This in turn makes it possible to suppress unwanted creation of voids in the seal resin 2 of the multilayer TCP. In other words, it is possible to simultaneously seal respective semiconductor chips 2 of the laminated tape carriers 1 while retaining them in a stable state. Additionally, arrows in FIG. 29 designate flow directions of the molten seal resin.

Then, the resulting TCP is removed from the molding die 5 after completion of the resin sealing process. When this is done, in the seventh embodiment, the plating-effected copper thin-film layer 1a3 is formed at part of the tape base 1a of the lowermost layer which faces the sub-runner 5c thereby enabling reduction of adhesivity of the seal resin 3 at such part, which in turn makes it possible to readily remove any residual resin components attached to such part.

Figure 30:
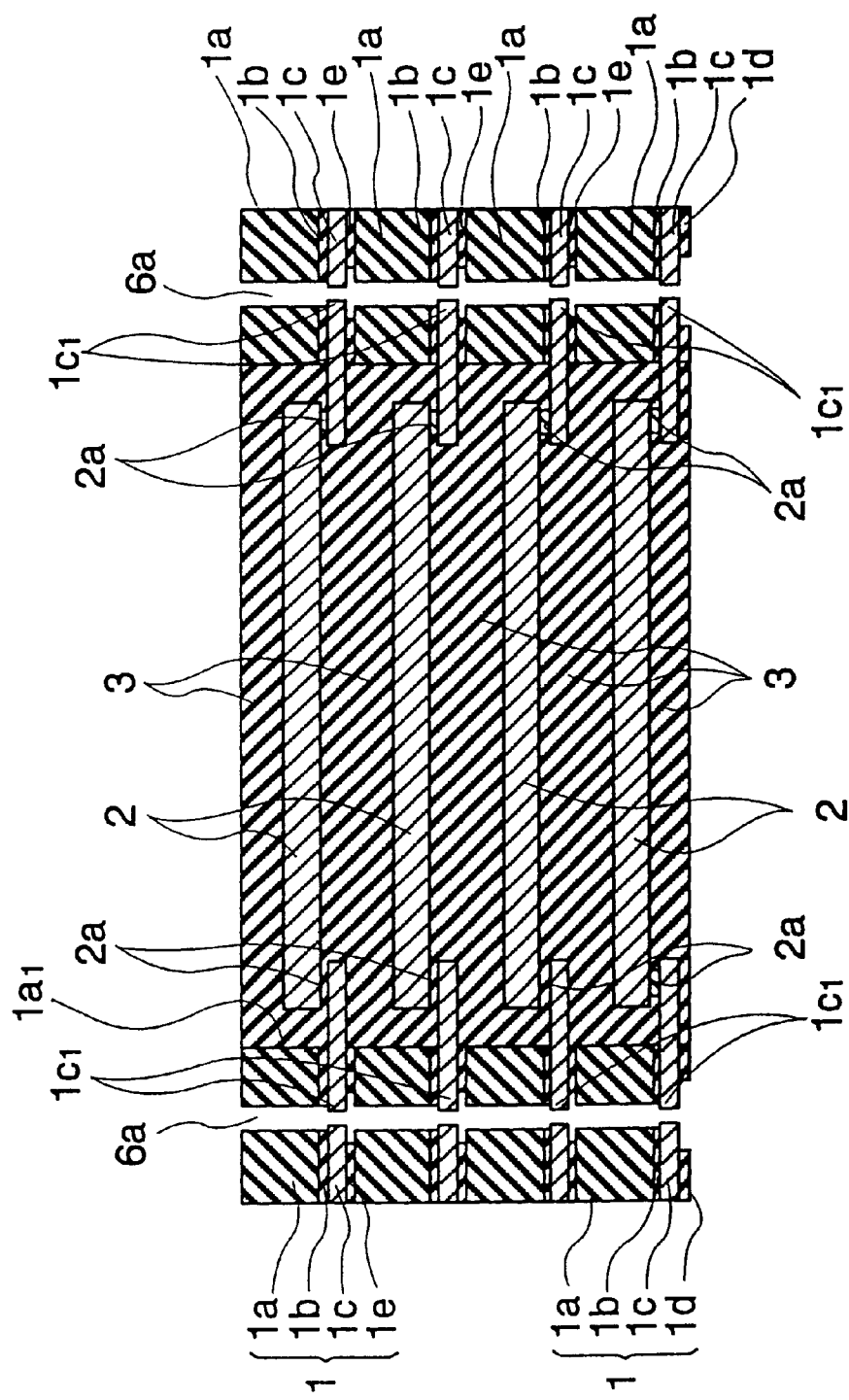

In this way, a multilayer TCP is manufactured by sealing all of the multiple semiconductor chips 2 by using the seal resin 3 at one time as shown in FIG. 30. In the seventh embodiment also, both the principal surface and back surface of each semiconductor chip 2 are well coated with the seal resin 3. Note that the seal resin 3 is formed so that it is coincident with the upper and lower surface levels of the tape carrier 1.

Subsequently, the laminated TCP is subject to aging processes and screening inspection procedures plus cut-into-pieces processes; and then, fill the connection holes 6a of such laminated TCP are filled with solder paste made for example of Pb—Sn or other similar suitable materials.

Figure 26:
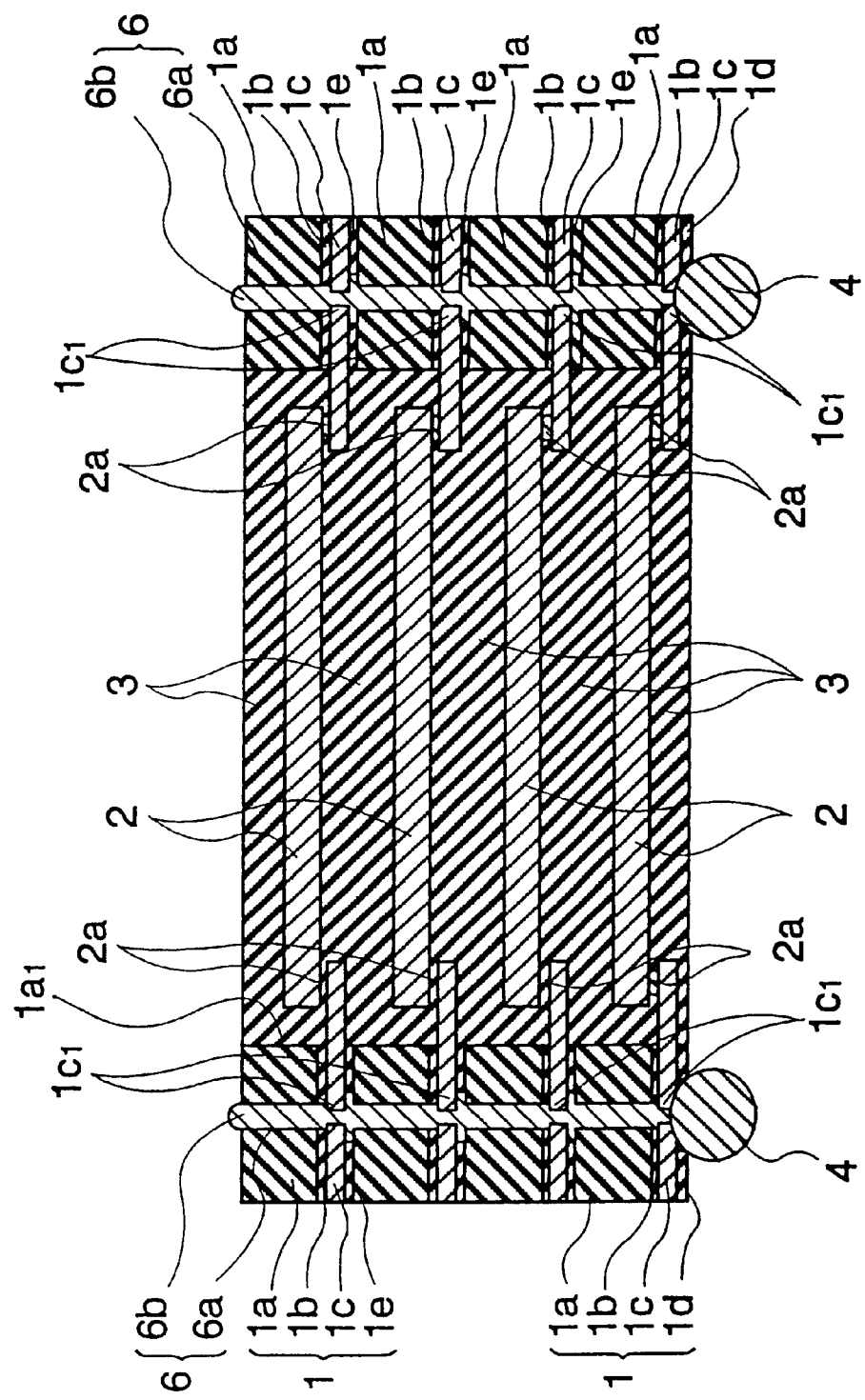
FIG. 26 shows a sectional view of a semiconductor device in accordance with another embodiment of the invention.

Thereafter, reflow processing is applied to the stacked TCP to form in the connection holes 6a the conductor portions 6b which have been indicated in FIG. 26; and then, the bump electrodes 4 made for example of Pb—Sn or the like are placed in contact with the bump underlayer pattern 1c1 of leads 1c at the tape carrier 1 of the lowermost layer of the multilayer TCP to thereby manufacture a semiconductor device having a multilayer TCP structure according to the seventh embodiment.

According to the seventh embodiment, the followinq technical effects and advantages are achievable in addition to those obtained in said fifth embodiment.

(1) Integral molding of the seal resin 3 of the multilayer TCP results in no gaps being formed between layers of seal resin 3 used in sealing the individual semiconductor chip 2, and so it becomes possible to improve the mechanical strength of a multilayer package when compared to said fifth embodiment while at the same time enhancing the humidity durability. Thus, it is possible to improve the reliability of the semiconductor device.

(2) Simultaneous fabrication of the seal resin 3 of the multilayer TCP may enable reduction in the number of the manufacturing process steps.

Figure 31:
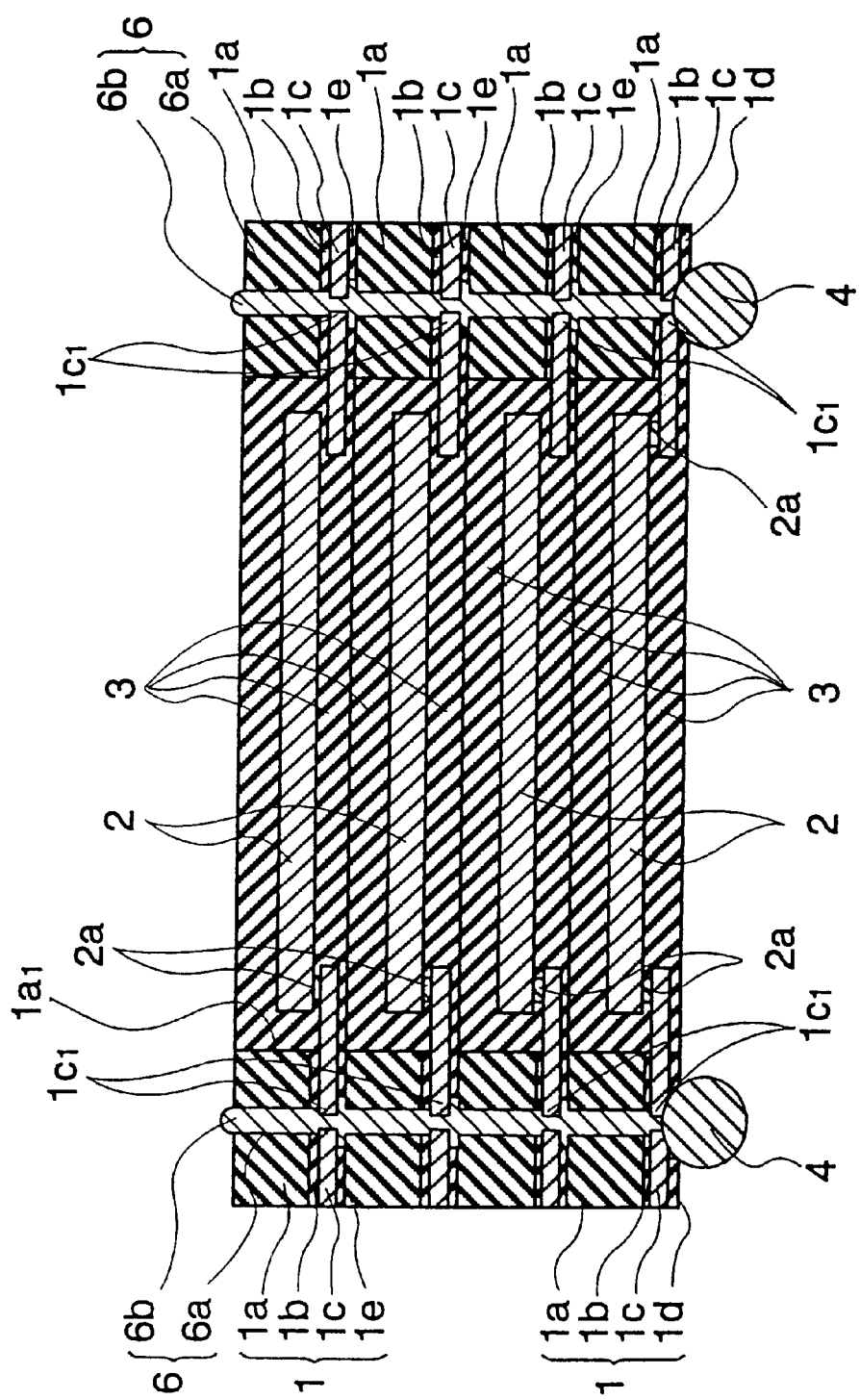
FIG. 31 shows a sectional view of a semiconductor device in accordance with another embodiment of this invention.

A semiconductor device in accordance with an eighth embodiment of the present invention will next be explained with reference to FIGS. 31–32. Note that FIG. 31 shows a sectional view taken along line XXXI—XXXI of FIG. 32. Note also that in FIG. 32 the solder resist and sealing resin are not depicted for purposes of convenience in illustration only.

The eighth embodiment being explained herein is one which applies the principles of this invention to a dynamic random access memory (DRAM) by way of example, wherein the semiconductor device is generally similar in structure to the fifth embodiment described above.

Figure 32:
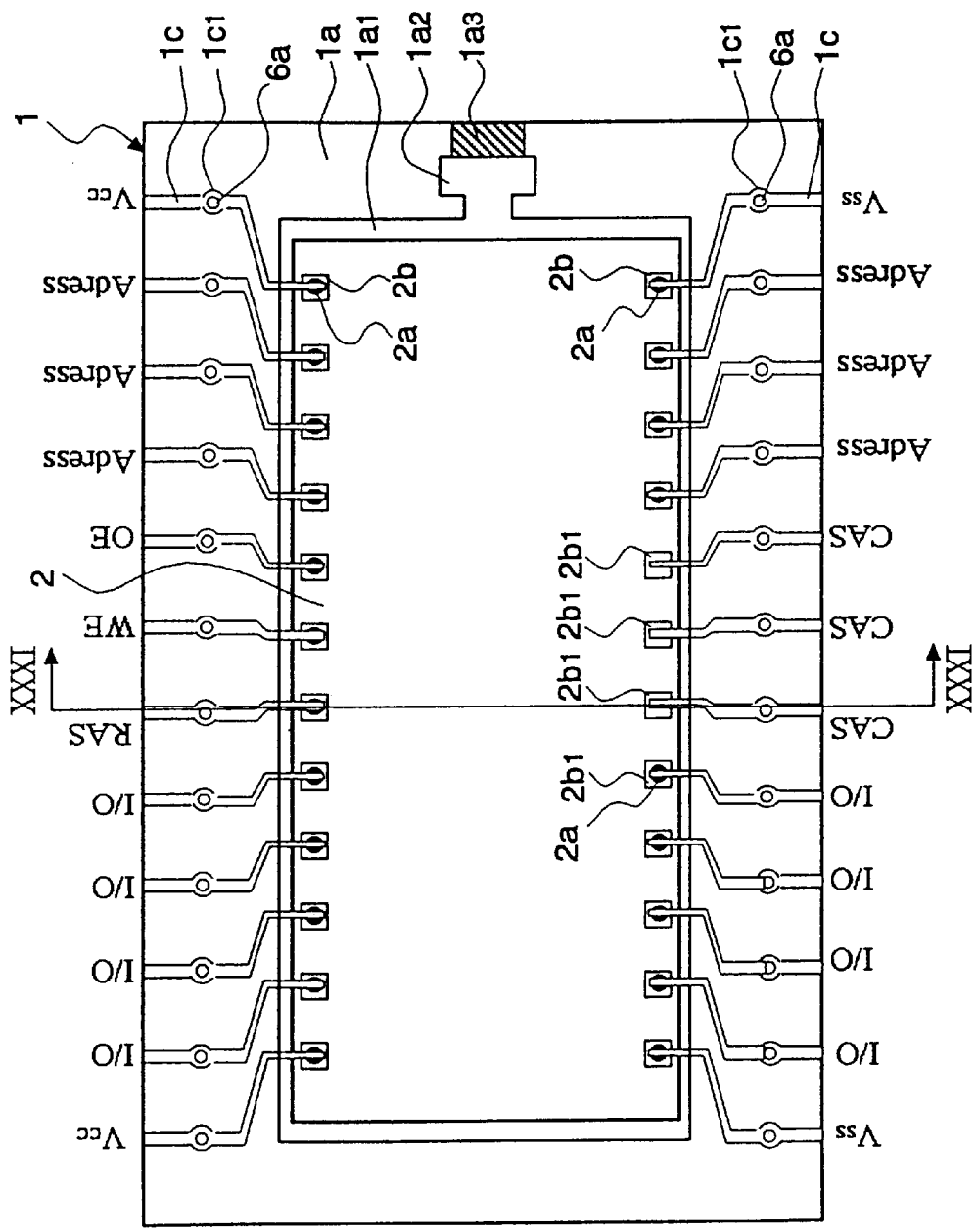
FIG. 32 shows a sectional view of the semiconductor device of FIG. 31.

In FIG. 32 the reference characters "Vcc," "Vss," "I/O," "RAS," "CAS," "WE," "OE," and "Address" are used to designate some major signals and power supply potentials which are allocated to respective leads 1c. In this regard, "Vcc" designates a high-potential power supply voltage; "Vss" denotes a low-potential power supply voltage; "I/O" indicates an input/output signal; "RAS" indicates a row address strobe signal; "CAS" denotes a column address strobe signal; "WE" denotes a write enable signal; "OE" denotes an output enable signal; and "Address" denotes an address signal.

Incidentally, in the eighth embodiment described herein, four CAS bonding pads 2b1 are substantially centrally disposed on a semiconductor chip 2, which pads function as chip select terminals. These CAS, bonding pads 2b1 are electrically connected by in-chip leads on the semiconductor chip 2.

And, a certain one of the four CAS bonding pads 2b1 has a bump electrode 2a provided thereon, through which bump the pad is electrically connected to its associated lead 1c. In other words the bonding pad 2b1 for chip selection is provided with the bump electrode 2a for electrical connection with the lead 1c.

The remaining CAS bonding pads 2b1, however, have no such bump electrodes corresponding to the electrode 2a, and none of these pads are electrically coupled to leads 1c. In other words, in the eighth embodiment, the connection path or route is modifiable by specifying whether the bump electrode 2a is provided on a bonding pad 2b. With such an arrangement, the use of a single type of tape carrier 1 may flexibly accommodate any desirable lead pattern modifications occurring in cases of employing multilayer TCP structures without having to newly prepare a separate "special purpose" tape carrier 1 which meets a design change on a caseby-case basis. This makes it possible to avoid the need for redoing the design and manufacture plus inspection of a tape carrier 1 whenever the connection route is altered, which may in turn drastically reduce the time required for manufacture of products while reducing the production costs.

In addition, although in the above example the connection route is rendered modifiable depending on the presence or absence of the bump electrode 2a, the present invention should not be limited to this arrangement only. For example, in case the distal end of the Au-plated lead 1c is connected to its associated bonding pad 2b in the absence of a bump electrode 2a laid therebetween as has been explained in the context of said third embodiment, bonding is eliminated with respect to a specific bonding pad 2b that is free from chip select events when allowing the lead 1c to be in contact with the bonding pad 2b using single-point bonding methods. In short the connection route may be changed by single-point bonding operations.

In this way, according to the eighth embodiment, the following advantage is achievable in addition to those obtained by said fifth embodiment.

(1) By modifying the connection route by specifying whether the bump electrode 2a is provided on a bonding pad 2b, the use of a single type of tape carrier 1 may flexibly accommodate any desirable lead pattern modifications occurring in the case of employing multilayer TCP structures without having to newly prepare a separate tape carrier 1 which meets a specific design change on a case-by-case basis. This makes it possible to reduce the time required to manufacture products while reducing costs.

Figure 33:
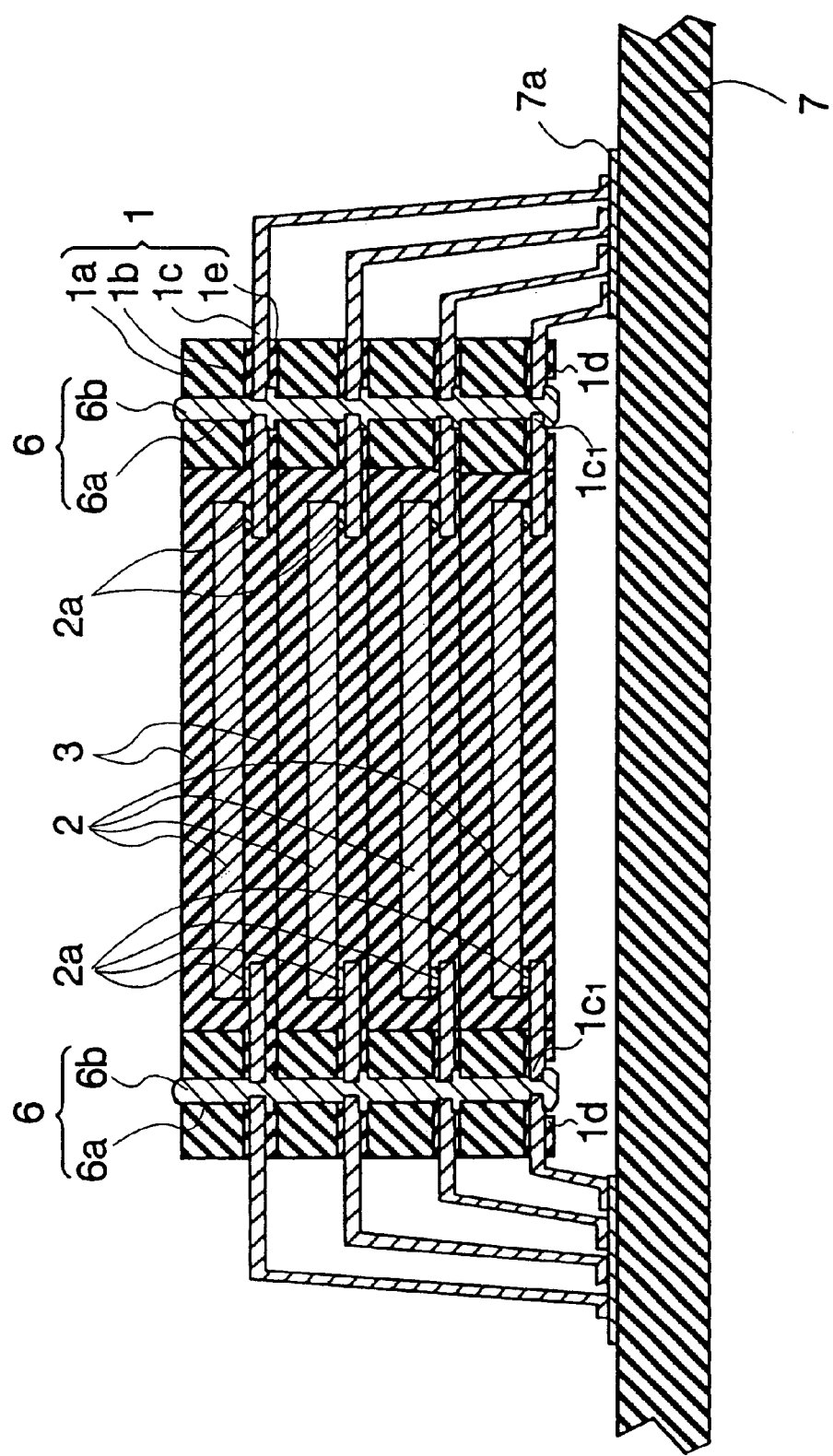
FIG. 33 is a sectional view of a semiconductor device also embodying the invention.

A semiconductor device in accordance with a ninth embodiment of the present invention will next be explained with reference to FIG. 33.

In the ninth embodiment the leads 1c are designed to extend from lateral surfaces of a tape carrier 1 at each of those layers constituting a multilayer TCP to have a so-called "gull-wing" shape for electrical connection with lands 7a on a printed circuit board 7.

Figure 34:
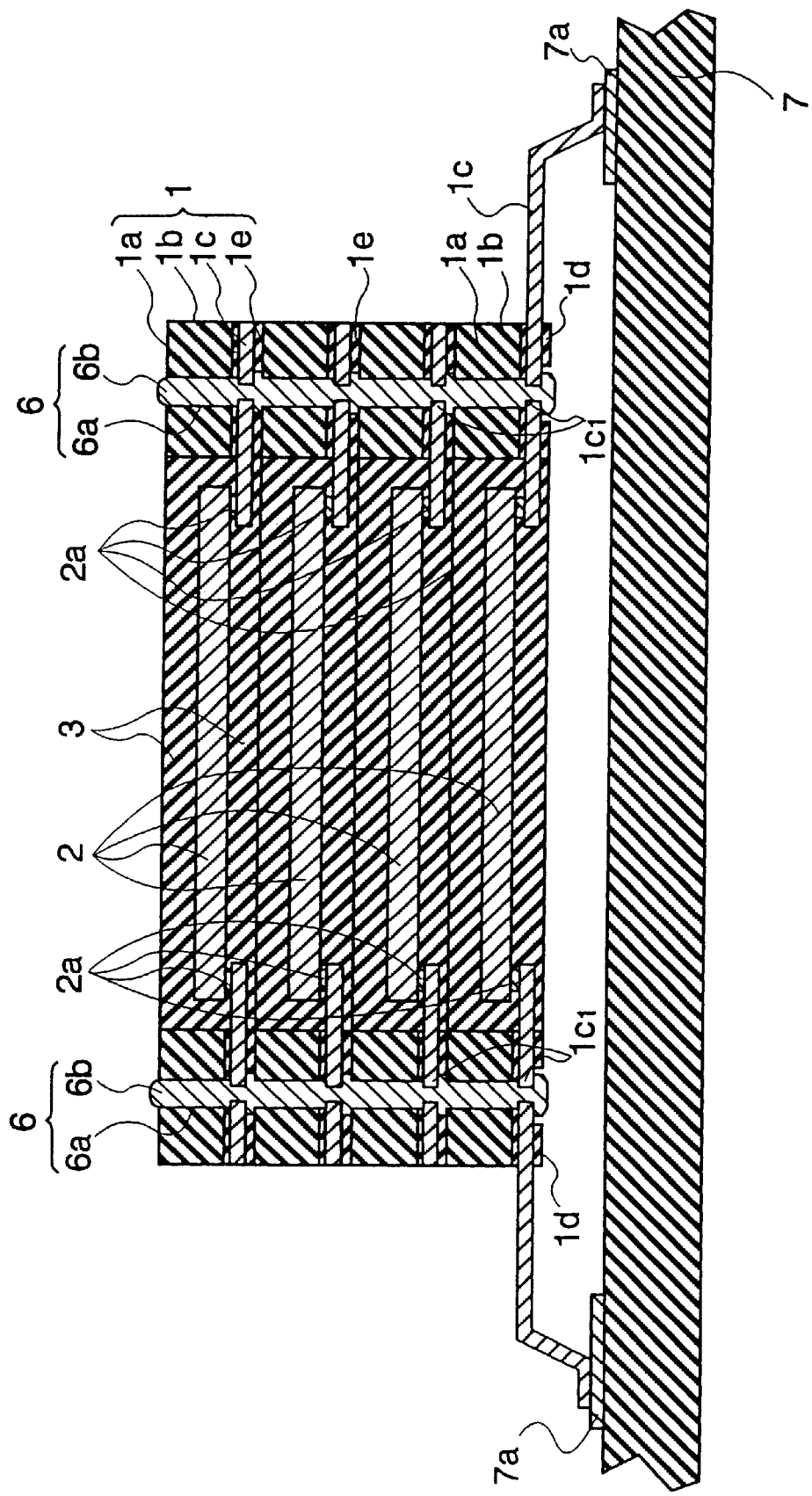
FIG. 34 is a sectional view of a semiconductor device also embodying the invention.

A semiconductor device in accordance with a tenth embodiment of the invention will next be explained with reference to FIG. 34.

In the tenth embodiment the leads 1c are designed to extend from lateral surfaces of a tape carrier 1 at the lowermost layer of those layers constituting a multilayer TCP to have a gullwing-like shape for electrical connection with lands 7a on a printed circuit board 7.

Figure 35:
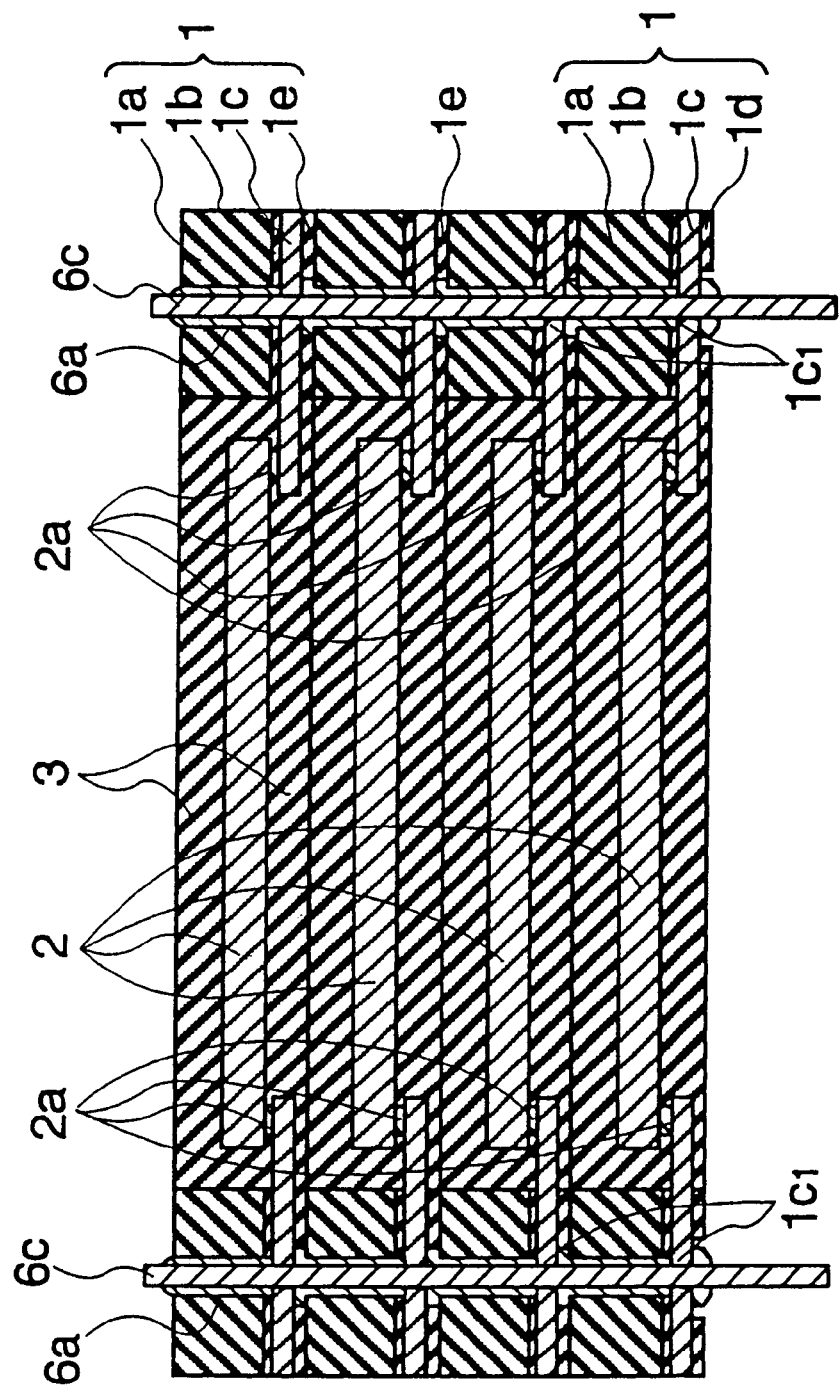
FIG. 35 is a sectional view of a semiconductor device also embodying the invention.

A semiconductor device in accordance with an eleventh embodiment of this invention will next be explained with reference to FIG. 35.

In the eleventh embodiment a conductive pin 6c that is inserted into a connection hole 6a as formed in each tape carrier 1 of a multilayer TCP is rigidly secured by a conductor portion 6b filled within the connection hole 6c to thereby form a connection section 6.

This conductive pin 6c is electrically connected between those leads 1c of the same electrical function on a tape carrier 1 of each layer while at the same time having one end that extends from the lower surface to form an external terminal. In summary , permitting insertion of the projected portion of this conductive pin 6c into a connection hole of a mounting board such as a printed circuit board may result in the multilayer TCP being mounted on the board while allowing the semiconductor chips 2 within the multilayer TCP to be electrically connected to leads of the mounting board.

In this way, in the eleventh embodiment, the following advantages are attainable in addition to those obtained by said fifth embodiment.

(1) Allowing external terminals to be conductive pins 6c may reduce the costs of products when compared to the case where such external terminals are constituted from bump electrodes or gullwing-shaped leads.

(2) Inserting strength-enhanced conductive pins 6c into connection holes 6c of the multilayer TCP makes it possible to improve the strength of the multilayer TCP as a whole.

A semiconductor device in accordance with a twelfth embodiment of the present invention will next be explained with reference to FIGS. 36–39.

Figure 36:
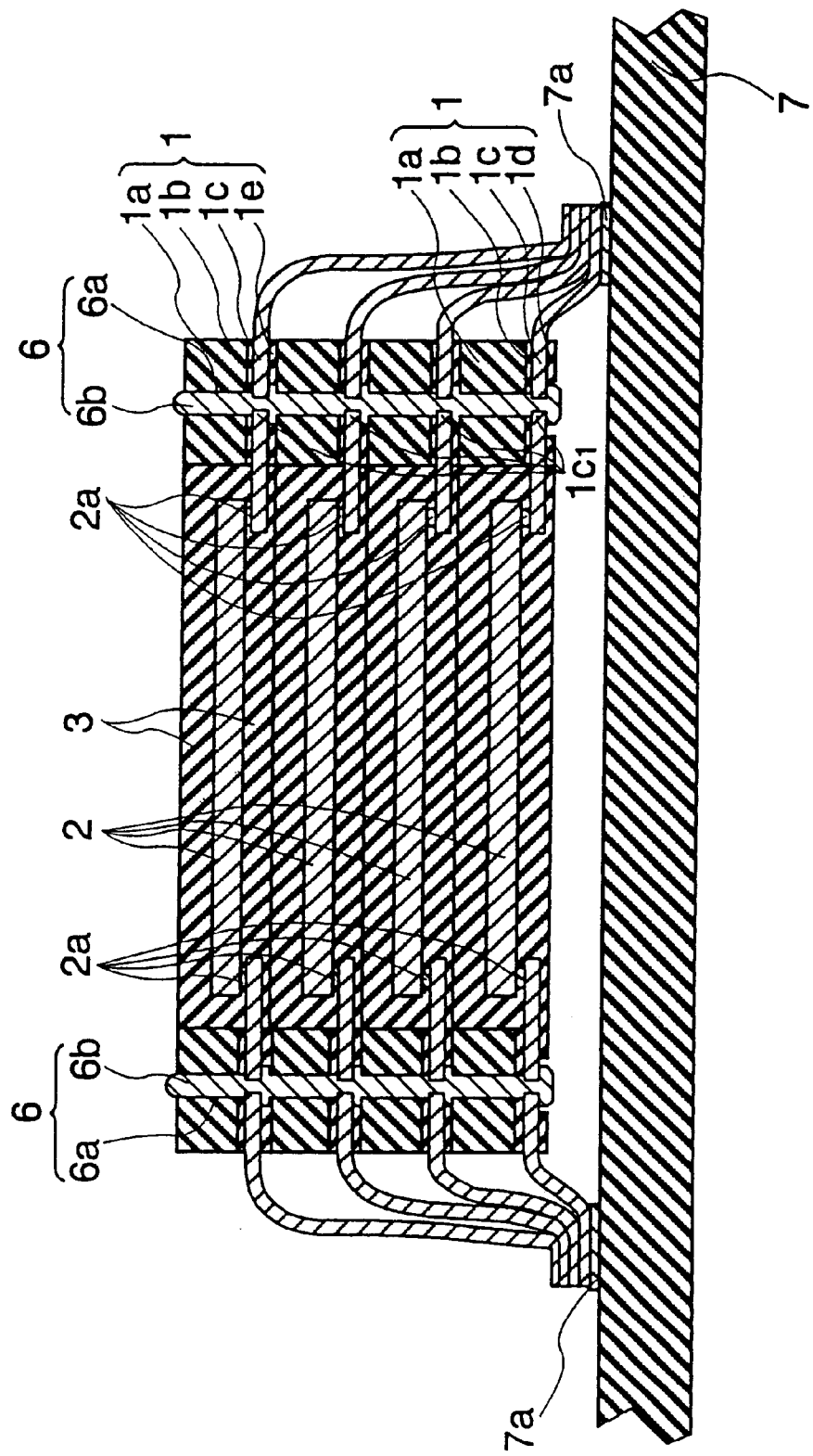
FIG. 36 is a sectional view of a semiconductor device also embodying the invention.

In the twelfth embodiment, as shown in FIG. 36, leads 1c are formed so that they project from lateral surfaces of the tape carriers 1 at respective layers constituting a multilayer TCP and are bent downwardly in FIG. 36, corresponding ones of which are then "bundled" together at their distal ends in a stacked fashion on lands 7a of a mounting board, typically a printed circuit board.

The stack-bundled leads 1c exhibit a spring-like deformability to relatively easily increase the mechanical strength of the structure of such leads 1c at low costs while simultaneously enabling absorption of stress occurring due to differences in thermal expansion between the multilayer TCP and the substrate 7. It is thus possible to increase the reliability of the semiconductor device after on-board installation.

A manufacturing method of the semiconductor device of the twelfth embodiment will be next described with reference to FIGS. 37–39.

Figure 37:
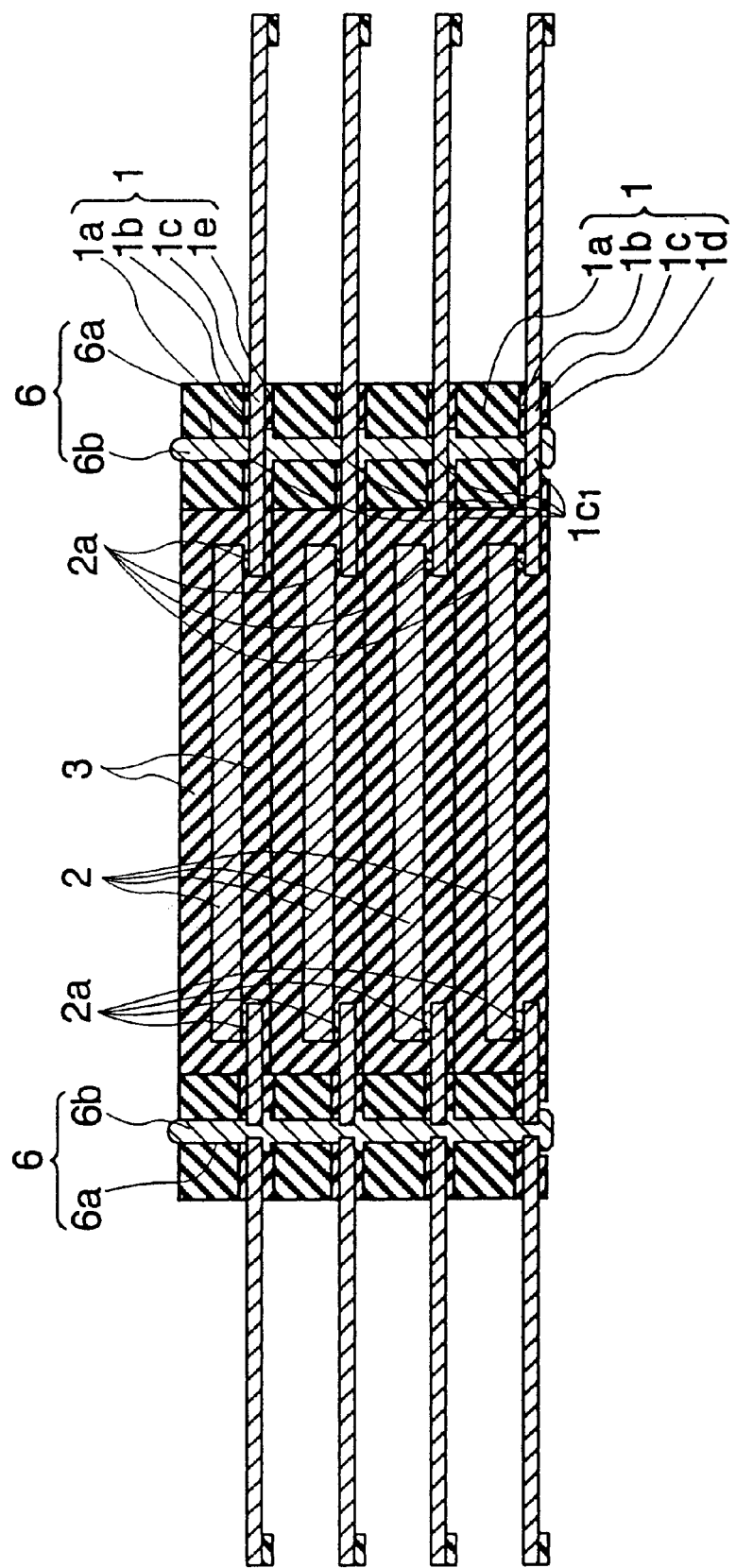
FIGS. 37–39 illustrate in cross-section some of the major steps in the manufacture of the semiconductor device shown in FIG. 36.

First, as shown in FIG. 37, a plurality of unitary TCPs are laminated and bonded together in a way similar to that in said fifth embodiment to thereby fabricate a multilayer TCP. At this stage of fabrication, the leads 1c are extended straight from lateral surfaces of respective tape carriers 1.

Figure 38:
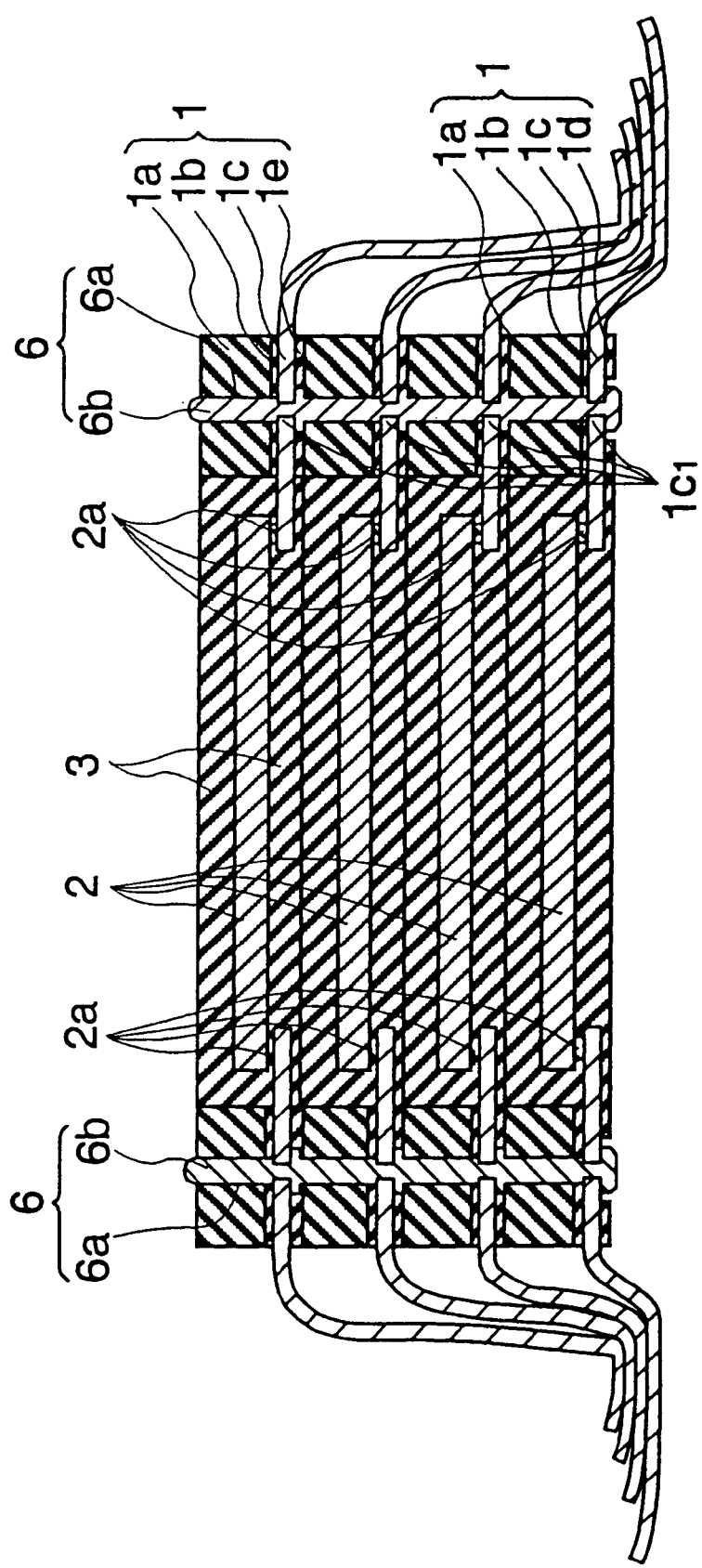
Figure 39:
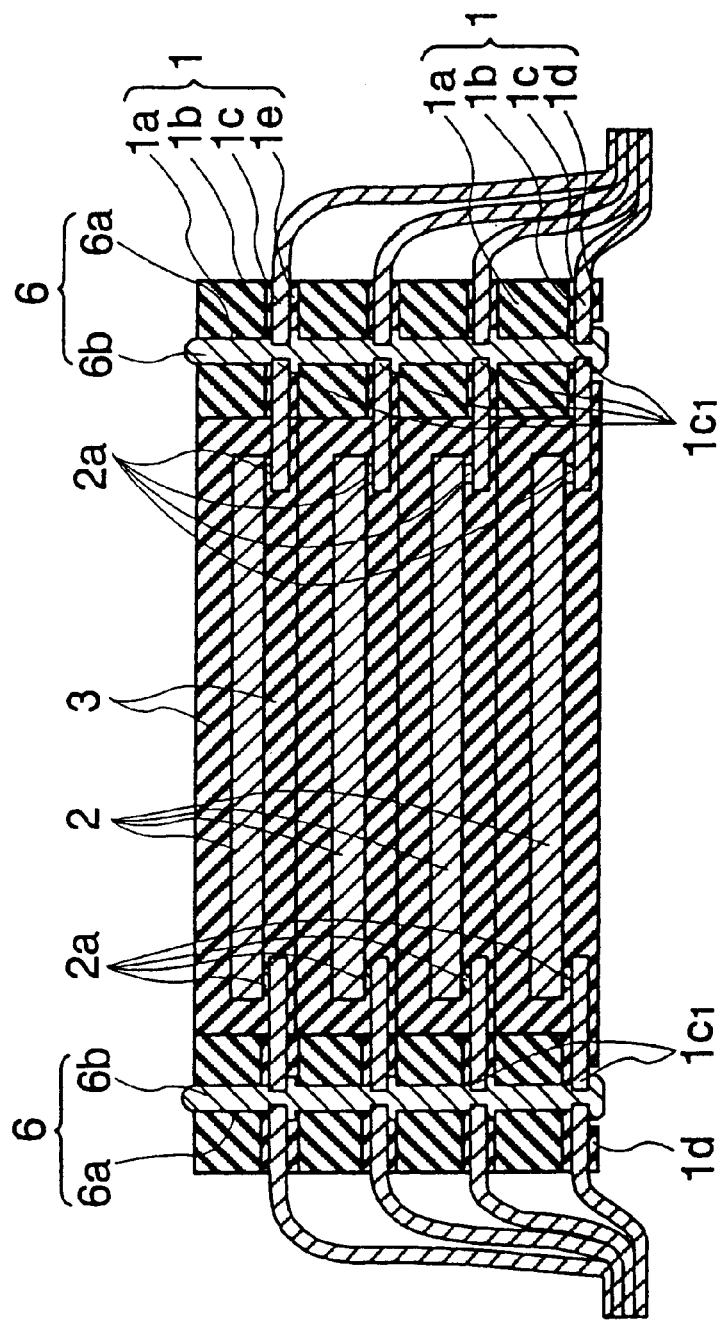

Subsequently, the leads 1c extending straight from the side surfaces of respective tape carriers 1 of the multilayer-TCP are pressed from the upward direction to machine all of the plural leads 1c at one time a state in which corresponding ones of the distal ends of the leads 1c overlap one another as shown in FIG. 38.

Thereafter, the ends of leads 1c as bent through the machining process are cut away thus causing the stacked ends of leads 1c to be aligned in position so that the semiconductor device of the twelfth embodiment is manufactured.

According to the twelfth embodiment obtained in the way stated above, the following advantages may be achieved in addition to those derived from said fifth embodiment.

(1) It becomes possible to relatively readily improve the mechanical strength of the lead structure at low cost.

(2) Effecting machining with the outer lead portions of leads 1c resiliently bent makes it possible to well compensate for or "absorb" any possible thermal expansion differences between the multilayer TCP and the mount substrate 7 such as a printed circuit board.

A semiconductor device in accordance with a thirteenth embodiment of the invention will next be explained with reference to FIGS. 40 and 41. Note that FIG. 41 is a sectional view taken along line XXXXI—XXXXI of FIG. 40, which shows a sectional view of a semiconductor chip and a machining metal mold tool at a resin sealing process step.

Figure 40:
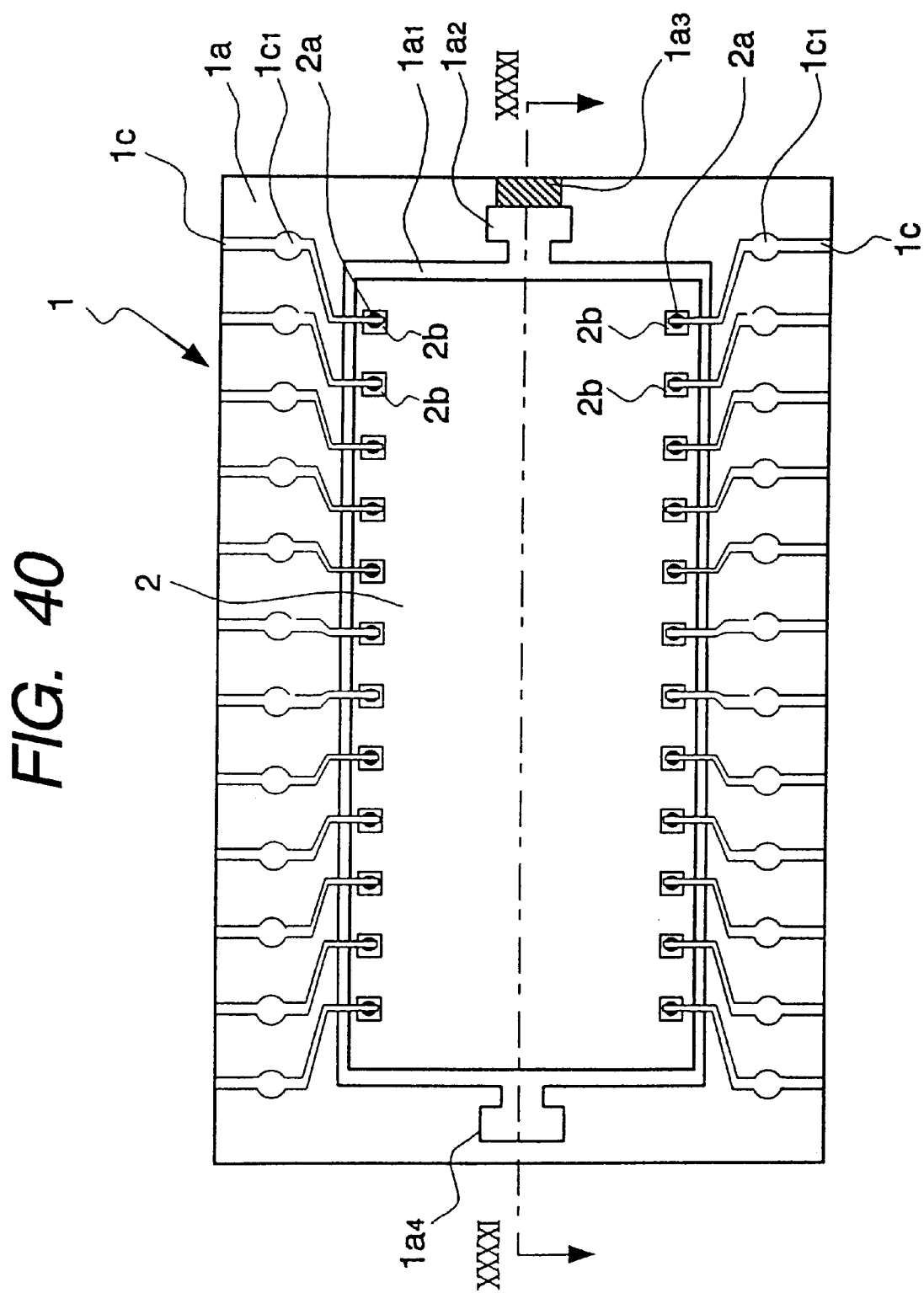
FIG. 40 shows a plan view of a semiconductor device in accordance with a further embodiment of the invention; and, FIG. 41 is a diagram showing in cross-section the semiconductor device of FIG. 40 at a seal resin machining process step in the manufacture thereof.
Figure 41:
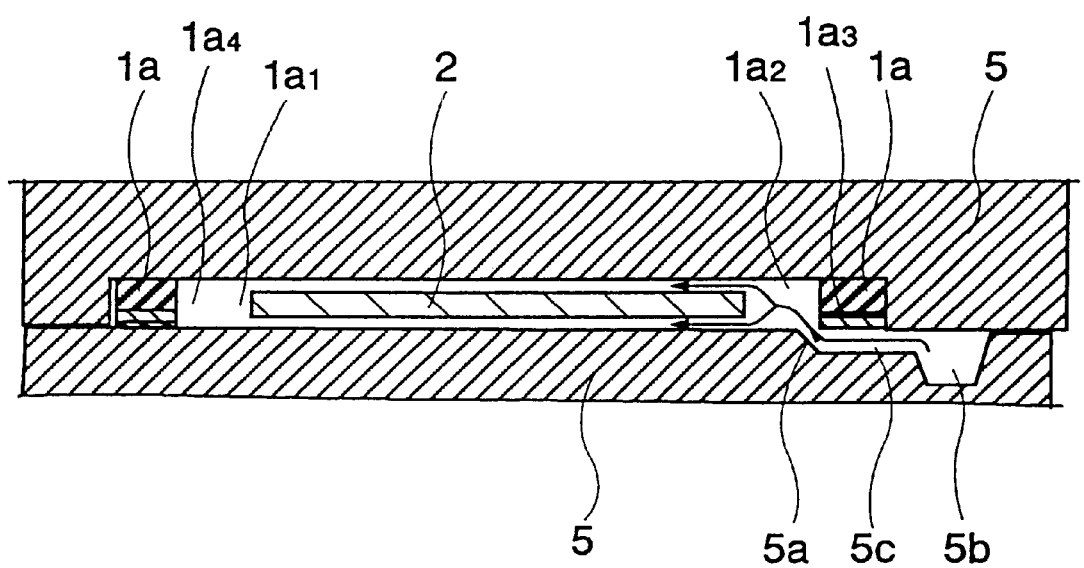

In the thirteenth embodiment, as shown in FIG. 40 and FIG. 41, an air exhaust port 1a4 is formed on a tape base 1a at a location on a shorter side of a device hole 1a1 which is the opposite side of the seal resin injection port 1a2 discussed above, the air exhaust port 1a4 extending from the device hole 1a1 in a direction toward a short outer side of the tape base 1*a*. This air exhaust port 1*a*4 is formed to resemble the letter "T" in its planar shape, for example.

This air exhaust port 1*a*4 is an opening for use to effect coupling between the air vent of the molding die 5 and the cavity, which opening is provided for allowing extra molten resin to flow thereinto thereby forcing air components residing within the cavity to escape to the outside of the cavity. In other words, the air exhaust port 1*a*4 offers functionality as part of the air vent during resin sealing processes. Additionally, it will be permissible for the resin to contain therein air within the air exhaust port 1*a*4.

It is thus possible to suppress the residence of air holes or "bubbles" within the seal resin 3 for use in coating both the principal surface and back surface of semiconductor chip 2, which in turn enables significant reduction of unwanted creation of voids and/or traps in the seal resin 3.

It is noted that the arrow in FIG. 41 designates the flow direction of the seal resin 3. Also note that in case the tape base 1*a* is used to constitute the multilayer TCP as has been explained with regard to said fifth embodiment and the like, more than one connection hole may be defined at a selected location corresponding to the bump underlayer pattern 1*c*1 of the lead 1*c*.

According to the thirteenth embodiment obtained in the way stated above, the following advantage is achievable in addition to those obtained by said first and fifth embodiments.

(1) Providing at the opposite shorter side of the device hole 1*a*1 on the tape base 1*a* the air exhaust port 1*a*4 extending from the device hole 1*a*1 toward the short outer periphery of the tape base 1*a* and functioning as part of the air vent makes it possible to greatly suppress air holes or "bubbles" within the seal resin 3 for use in coating both the principal surface and back surface of the semiconductor chip 2, which may in turn enable significant reduction of unwanted creation of voids and/or traps in the seal resin 3. This in turn makes it possible to further increase the reliability of the semiconductor device.

So far, the present invention made by the inventors named in the subject application for patent has been described in detail based on some specific preferred embodiments thereof; however, it will be understood by those skilled in the art that the invention should not be limited to said first to thirteenth embodiments only, and may be modifiable and alterable in a variety of possible forms without departing from the spirit and scope of the invention.

For example, although in said fifth embodiment the solder paste is filled into connection holes for connecting between the unitary TCPs of the multilayer TCP, the invention should not be limited only to this arrangement and may alternatively be modified so that conductive resin paste, for example, is filled in place thereof. If this is the case, after the connection holes are filled with such conductive resin paste, thermal hardening treatment is done forming a thermally hardened paste material within the connection holes to thereby achieve the intended electrical interconnection between respective unitary TCPs.

Still, alternatively, conductor portions within such connection holes may be formed by electroplating techniques. In this case formation of the conductor portions may be made easier because of the fact that traditionally employed plating processing is used to form such conductor portions in the connection holes.

As has been described above, the semiconductor device incorporating the principles of the invention is adaptable for use as a semiconductor device built in electronic equipment including but not limited to computers, portable radiotelephone handsets, or video cameras and also in integrated circuit (IC) cards as well as memory cards.

What is claimed is:

1. A semiconductor device comprising:
   a semiconductor chip having a principal surface and a back surface, and including an integrated circuit and a plurality of external terminals formed on said principal surface;
   a tape carrier having a base substrate and a plurality of lead portions formed on one surface of said base substrate, said base substrate having a device hole and a plurality of through hole wirings formed at both sides of said device hole, said plurality of through hole wirings extending from said one surface to the other surface of said base substrate and being electrically connected to said plurality of lead portions,
   wherein said semiconductor chip is disposed in said device hole of said base substrate and first ends of said plurality of lead portions are electrically connected to said plurality of external terminals of said semiconductor chip, and
   wherein said semiconductor chip has a reduced thickness defined by spin-etching of said back surface to effect a thinning of said semiconductor chip to a thickness less than that of said tape carrier,
   a seal resin material sealing said thinned semiconductor chip so that said principal surface and said back surface of said semiconductor chip are covered with said seat resin material; and
   a plurality of bump electrodes formed on said one surface of said base substrate at said plurality of through hole wirings and being electrically connected to said plurality of lead portions, said plurality of bump electrodes providing a connection with a printed circuit board, while said plurality of through hole wirings at the other surface of said base substrate providing a connection with another device to be mounted on said tape carrier.

2. The semiconductor device as recited in claim 1, wherein said semiconductor chip is disposed on a stress neutral plane extending parallel to the principal surface of said semiconductor chip at a position along the thickness direction of said tape carrier.

3. The semiconductor device as recited in claim 1, characterized in that said lead is bent in its thickness direction to be electrically connected to said external terminal.

4. The semiconductor device as recited in claim 1, wherein said seal resin material has its upper and lower surfaces substantially identical in level to upper and lower surfaces of said tape carrier.

5. The semiconductor device as recited in claim 1, wherein an injection port for use in seal resin injection is provided at part of said tape carrier to effect coupling of said device hole to a gate of a metal mold structure used during formation of said seal resin.

6. The semiconductor device as recited in claim 5, wherein said tape carrier has an air exhaust port formed so that the device hole of said tape carrier is coupled to an air vent of the metal mold structure used during formation of said resin seal.

7. The semiconductor device as recited in claim 5, wherein an electroplated metal layer is formed at part of a surface of said tape carder in close proximity to said injection port for seal resin injection, the part being brought into contact with the seal resin during formation of said resin seal.

8. The semiconductor device as recited in claim 1, wherein said tape carrier has an air exhaust port formed so that the device hole of said tape carrier is coupled to an air vent of a metal mold structure used during formation of said resin seal.

9. The semiconductor device as recited in claim 1, wherein said bump electrodes are electrically connected to corresponding ones of leads of said printed circuit board.

10. The semiconductor device as recited in claim 1, characterized in that said lead has its other end extending from an outer periphery of said tape carrier to thereby form an outer lead section electrically connected to more than one lead of a mount board for use in mounting thereon the semiconductor device.

11. The semiconductor device as recited in claim 1, wherein said semiconductor chip has its back surface polished by a spin-etching technique.

12. The semiconductor device as recited in claim 1, wherein a gold bump electrode is provided at each external terminal of said semiconductor chip, said gold bump electrode being coupled to said first end of a respective lead.

13. The semiconductor device as recited in claim 1, wherein electroplating is applied to said first ends of said leads causing the lead ends to be connected to corresponding ones of external terminals of said semiconductor chip.

14. A semiconductor device comprising:
a semiconductor chip having a principal surface and a back surface, opposite to said principal surface, and including an integrated circuit and a plurality of external terminals formed on said principal surface;
a base wiring substrate having a plurality of lead portions formed on one surface of said base wiring substrate, said base wiring substrate having a device hole and a plurality of through hole wirings formed at both sides of said device hole, said plurality of through hole wirings extending from said one surface to the other surface of said base wiring substrate and being electrically connected to said plurality of lead portions,
wherein said semiconductor chip is disposed in said device hole of said base wiring substrate and said plurality of lead portions are electrically connected to said plurality of external terminals of said semiconductor chip, and
wherein said semiconductor chip has a reduced thickness defined by spin-etching of said back surface to effect a thinning of said semiconductor chip to a thickness less than that of said base wiring substrate;
a seal resin material sealing said thinned semiconductor chip so that said principal surface and said back surface of said semiconductor chip are covered with said seal resin material; and
a plurality of bump electrodes formed on said one surface of said base wiring substrate at said plurality of through hole wirings and being electrically connected to said plurality of lead portions, said plurality of bump electrodes providing a connection with a printed circuit board, while said plurality of through hole wirings at the other surface of said base wiring substrate providing a connection with another device to be stacked on said base wiring substrate.

15. A semiconductor device as recited in claim 14, herein said base wiring substrate includes a flexible base tape.

* * * * *